US012022646B2

(12) United States Patent
Kim

(10) Patent No.: US 12,022,646 B2
(45) Date of Patent: Jun. 25, 2024

(54) SEMICONDUCTOR DEVICE AND METHOD FOR FABRICATING THE SAME

(71) Applicant: SK hynix Inc., Gyeonggi-do (KR)

(72) Inventor: Seung Hwan Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 28 days.

(21) Appl. No.: 17/212,693

(22) Filed: Mar. 25, 2021

(65) Prior Publication Data

US 2022/0122977 A1    Apr. 21, 2022

(30) Foreign Application Priority Data

Oct. 16, 2020   (KR) .......................... 10-2020-0134490

(51) Int. Cl.
*H10B 12/00* (2023.01)
*H01L 29/04* (2006.01)
*H01L 29/16* (2006.01)

(52) U.S. Cl.
CPC ............ *H10B 12/30* (2023.02); *H01L 29/04* (2013.01); *H01L 29/16* (2013.01); *H10B 12/03* (2023.02); *H10B 12/05* (2023.02); *H10B 12/09* (2023.02); *H10B 12/482* (2023.02); *H10B 12/50* (2023.02)

(58) Field of Classification Search
CPC ........... H01L 27/10805; H01L 27/1085; H01L 27/10873; H01L 27/10885; H01L 27/10894; H01L 27/10897; H01L 29/04; H01L 29/16; H01L 27/10891; H01L 27/10847; H01L 27/222; H01L 27/228; H01L 27/2481; H01L 28/86
See application file for complete search history.

(56) References Cited

U.S. PATENT DOCUMENTS

| 5,250,831 | A | 10/1993 | Ishii |
| 6,282,116 | B1 | 8/2001 | Kunkel et al. |
| 2006/0214209 | A1 | 9/2006 | Doyle |
| 2009/0134442 | A1 | 5/2009 | Lin et al. |
| 2009/0230449 | A1 | 9/2009 | Sakaguchi et al. |
| 2018/0323199 | A1* | 11/2018 | Roberts ................. H10B 12/05 |
| 2019/0006376 | A1* | 1/2019 | Ramaswamy ......... H10B 12/30 |
| 2019/0074277 | A1* | 3/2019 | Ramaswamy ........ G11C 11/221 |

(Continued)

FOREIGN PATENT DOCUMENTS

| CN | 109841630 A | 6/2019 |
| CN | 111052377 A | 4/2020 |

(Continued)

OTHER PUBLICATIONS

Office Action on the Chinese Patent Applicaiton No. 202110684537.4 issued by the Chinese Patent Office on Mar. 13, 2024.

*Primary Examiner* — Edward Chin
(74) *Attorney, Agent, or Firm* — IP & T GROUP LLP

(57) ABSTRACT

A semiconductor device includes: a plurality of active layers stacked in a first direction perpendicular to a substrate and laterally oriented in a second direction intersecting with the first direction; a plurality of bit lines each of which is coupled to one side of each of the active layers and laterally oriented in a direction intersecting with the first direction and the second direction; a plurality of capacitors each of which is coupled to another side of each of the active layers; and a word line vertically oriented penetrating the active layers in the first direction.

10 Claims, 34 Drawing Sheets

(56) References Cited

U.S. PATENT DOCUMENTS

| | | | |
|---|---|---|---|
| 2019/0074363 A1 | 3/2019 | Zhu | |
| 2019/0103407 A1 | 4/2019 | Kim et al. | |
| 2020/0227418 A1 | 7/2020 | Kim et al. | |
| 2020/0321349 A1 | 10/2020 | Kwon et al. | |
| 2020/0388617 A1* | 12/2020 | Ramaswamy | H10B 12/30 |
| 2020/0411522 A1* | 12/2020 | Tang | H01L 28/86 |
| 2021/0013210 A1* | 1/2021 | Lee | H10B 12/30 |
| 2021/0125991 A1* | 4/2021 | Kim | G11C 11/4097 |
| 2022/0310612 A1* | 9/2022 | Okajima | H10B 12/30 |
| 2023/0200051 A1* | 6/2023 | Aoki | G11C 11/4091 |
| | | | 257/43 |

FOREIGN PATENT DOCUMENTS

| | | |
|---|---|---|
| CN | 111627885 A | 9/2020 |
| JP | S60152056 A | 8/1985 |
| TW | 393731 B | 6/2000 |

\* cited by examiner

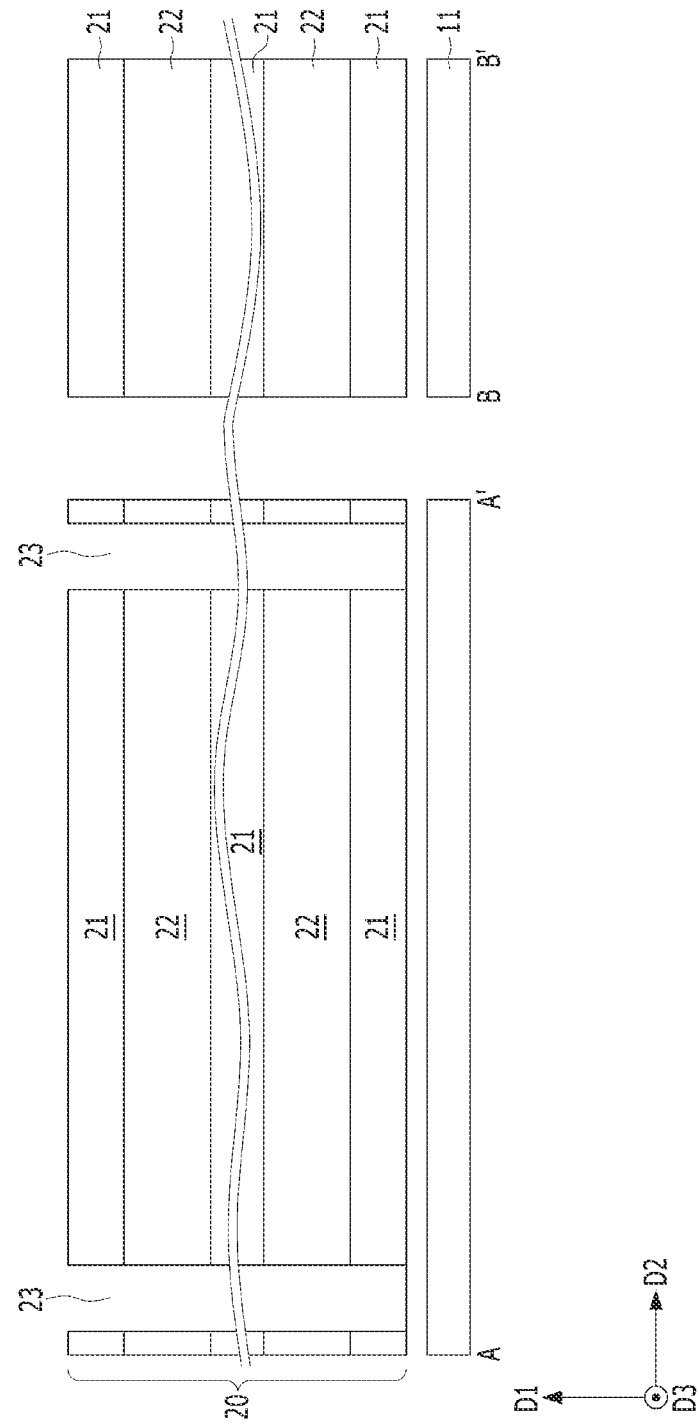

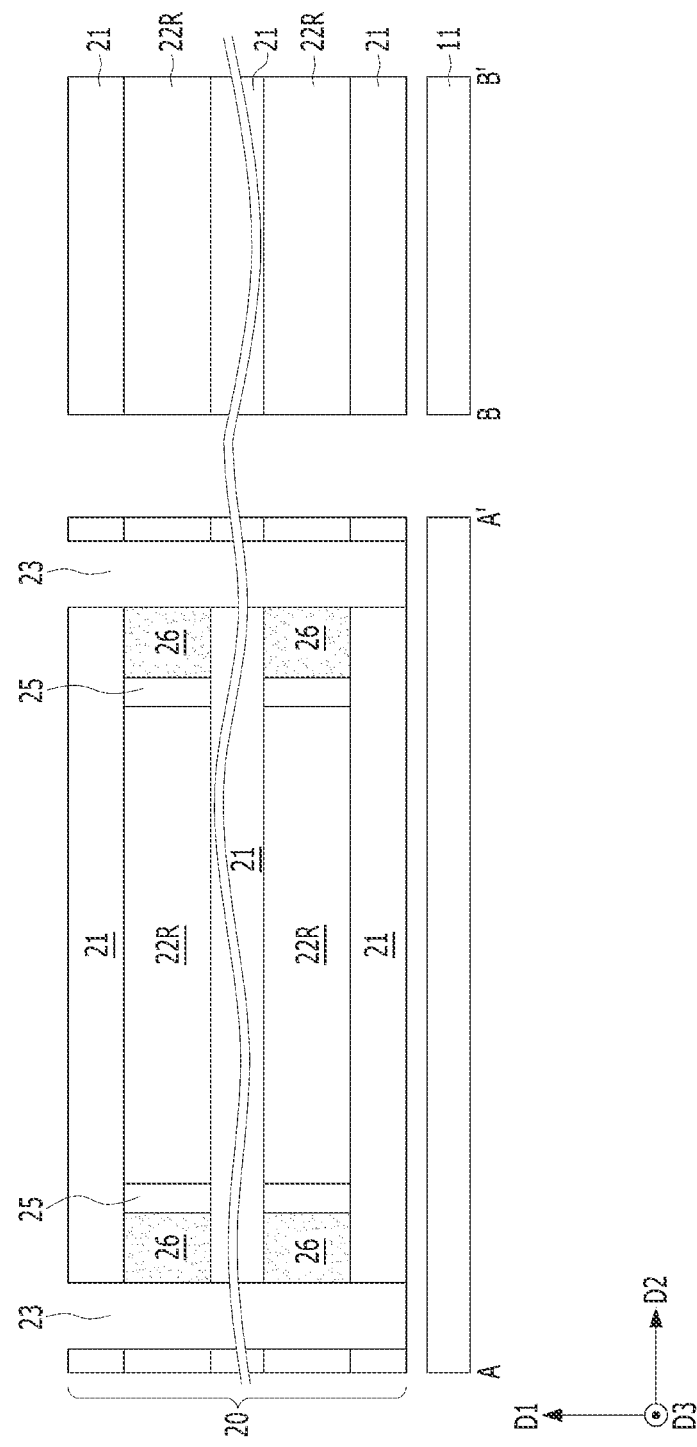

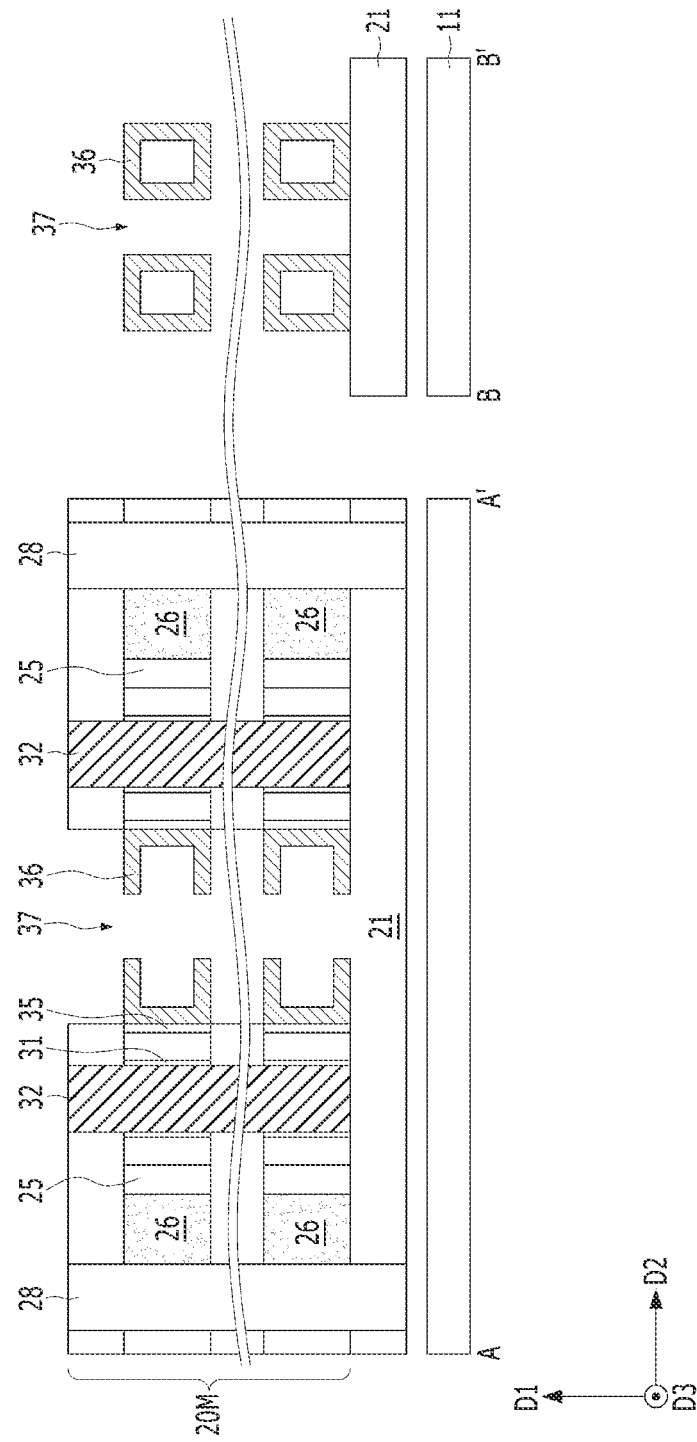

SEMICONDUCTOR DEVICE AND METHOD FOR FABRICATING THE SAME

CROSS-REFERENCE TO RELATED APPLICATIONS

The present application claims priority to Korean Patent Application No. 10-2020-0134490, filed on Oct. 16, 2020, which is incorporated herein by reference in its entirety.

BACKGROUND

1. Field

Various embodiments of the present invention relate to a semiconductor device, and more particularly, to a semiconductor device including a memory cell stack, and a method for fabricating the same.

2. Description of the Related Art

Recently, in order to increase the net die of a memory device, the size of the memory cell has been continuously reduced.

As the size of memory cells becomes smaller, parasitic capacitance Cb should be reduced and capacitance should be increased. However, it is difficult to increase the net die due to structural limitations of memory cells.

SUMMARY

Embodiments of the present invention are directed to a semiconductor device including highly integrated memory cells, and a method for fabricating the semiconductor device.

In accordance with an embodiment of the present invention, a semiconductor device includes: a plurality of active layers stacked in a first direction perpendicular to a substrate and laterally oriented in a second direction intersecting with the first direction; a plurality of bit lines each of which is coupled to one side of each of the active layers and laterally oriented in a direction intersecting with the first direction and the second direction; a plurality of capacitors each of which is coupled to another side of each of the active layers; and a word line vertically oriented penetrating the active layers in the first direction.

In accordance with another embodiment of the present invention, a method for fabricating a semiconductor device includes: forming an etch stop layer over a substrate; forming a mold stack in which dielectric layers and semiconductor layers are alternately stacked over the etch stop layer; forming a first trench by etching the mold stack; recessing one side of the semiconductor layers through the first trench to form first recess portions between the dielectric layers; forming bit lines that are laterally oriented in the first recess portions; etching the mold stack in a direction intersecting with the bit lines to form a second trench that divides the mold stack into a plurality of line-type stacks; and forming a vertically oriented word line through the line-type stacks.

In accordance with yet another embodiment of the present invention, a method for fabricating a semiconductor device includes: preparing a substrate including a peripheral circuit; forming a mold stack in which dielectric layers and active layers are alternately stacked over the substrate; replacing one side of the active layers with laterally oriented bit lines; forming an isolation layer that divides the mold stack into a plurality of line-type stacks; forming a vertically oriented word line that penetrates the active layers; and forming a laterally oriented capacitor that is coupled to another side of the active layers.

These and other features and advantages will become better understood from the following drawings and detailed description.

DETAILED DESCRIPTION

Figure 1:
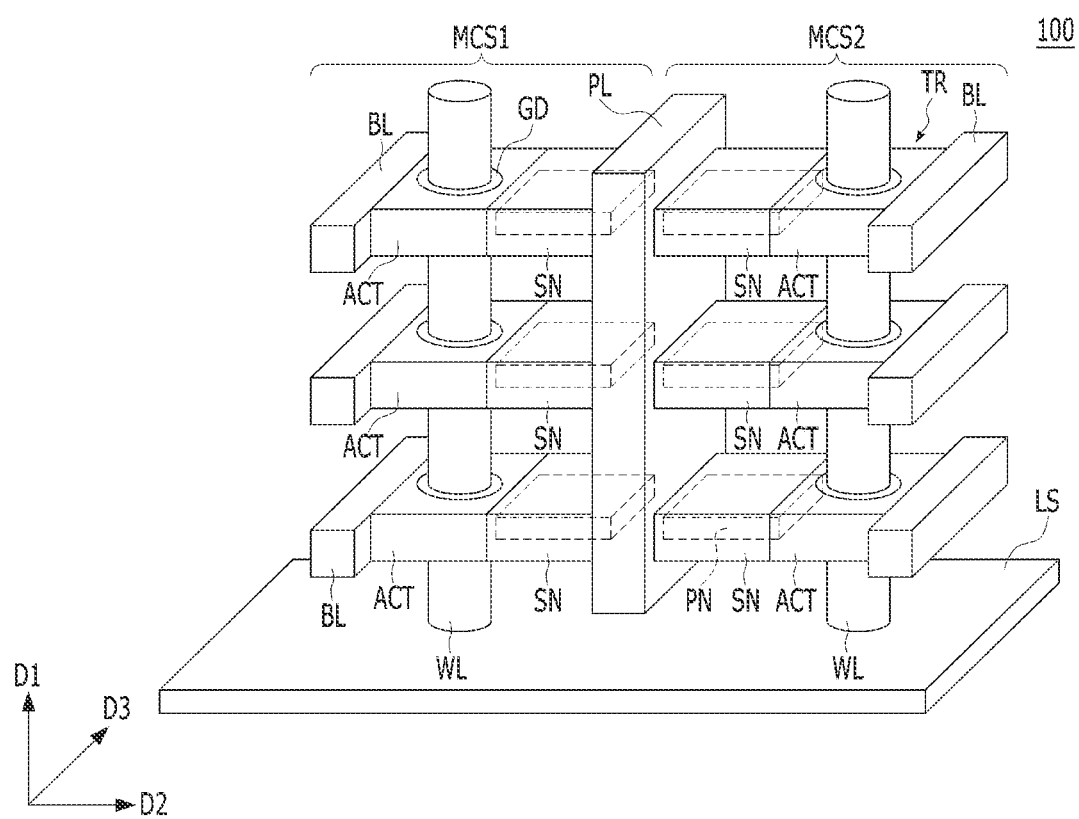
FIG. 1 is a schematic perspective view of a semiconductor device in accordance with an embodiment of the present invention.

Various embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

In the following embodiment of the present invention, memory cells may be vertically stacked to increase memory cell density and reduce parasitic capacitance.

Figure 2:
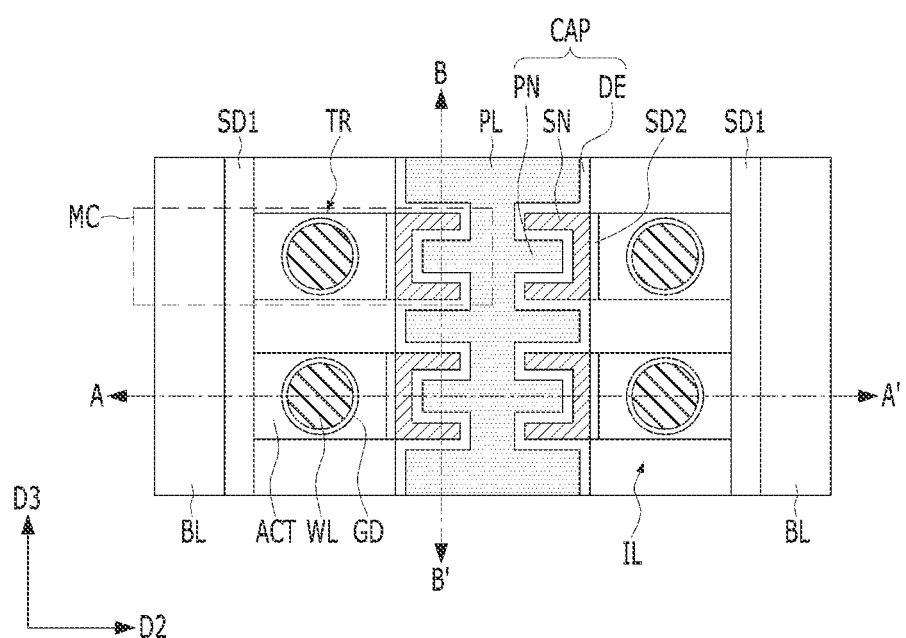
FIG. 2 is a layout of the semiconductor device.
Figure 3:
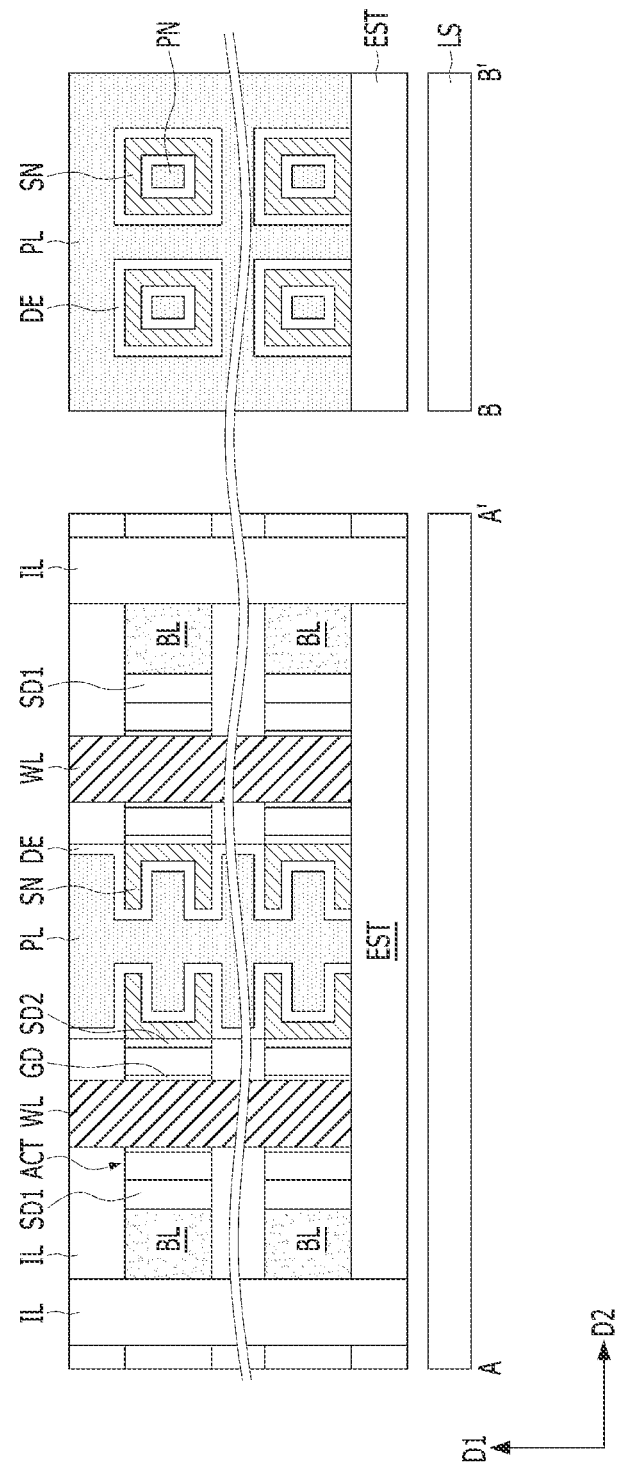
FIG. 3 are cross-sectional views taken along lines A-A' and B-B' of FIG. 2.

FIG. 1 is a schematic perspective view of a semiconductor device 100 in accordance with an embodiment of the present invention. FIG. 2 is a layout of the semiconductor device 100. FIG. 3 shows cross-sectional views taken along line A-A' and line B-B' shown in FIG. 2.

Referring to FIGS. 1 to 3, the semiconductor device 100 may include a substrate LS, and a plurality of memory cell stacks, e.g., memory stacks MCS1 and MCS2 formed over the substrate LS. The memory cell stacks MCS1 and MCS2 may be oriented in a first direction D1 which is perpendicular to the substrate LS. The substrate LS may extend in a plane defined in a second and a third direction D2 and D3. The memory cell stacks MCS1 and MCS2 may be oriented perpendicular to the plane of the substrate LS. The memory cell stacks MCS1 and MCS2 may be vertically oriented upwardly from the substrate LS in a first direction D1. The memory cell stacks MCS1 and MCS2 may be positioned over an etch stop layer EST as shown in FIG. 3. The memory cell stacks MCS1 and MCS2 may include a three-dimensional array of memory cells MC. Each of the memory cell stacks MCS1 and MCS2 may include a plurality of memory cells MC, Each of the memory cells MC of the memory cell stacks MCS1 and MCS2 may include a bit line BL, a transistor TR, a capacitor CAP, and a plate line PL. The transistor TR and the capacitor CAP may be laterally oriented in the second direction D2. Each memory cell MC may further include a word line WL. The word line WL may be vertically oriented in the first direction D1. The bit line BL may be laterally oriented in the third direction D3. In each memory cell MC, the bit line BL, the transistor TR, the capacitor CAP, and the plate line PL may be disposed in a lateral arrangement in the second direction D2. The memory cell stacks MCS1 and MCS2 may be referred to as a memory cell array. The memory cell stacks MCS1 and MCS2 may include a Dynamic Random-Access Memory (DRAM) memory cell array. According to another embodiment of the present invention, the memory cell stacks MCS1 and MCS2 may include a Phase Change Random Access Memory (PCRAM), a Resistive Random-Access Memory (RERAM), a Magnetic Random-Access Memory (MRAM), and the like. The capacitor CAP may be replaced with other memory elements.

The substrate LS may be made of any material suitable for semiconductor processing. The substrate LS may include at least one among a conductive material, a dielectric material, and a semiconductor material. Diverse materials may be formed over the substrate LS. The substrate LS may include a semiconductor substrate. The substrate LS may be formed of a silicon-containing material. The substrate LS may include silicon, monocrystalline silicon, polysilicon, amorphous silicon, silicon germanium, monocrystalline silicon germanium, polycrystalline silicon germanium, carbon-doped silicon, a combination thereof, or a mufti-layer thereof. The substrate LS may also include other semiconductor materials, such as germanium. The substrate LS may include a III/V-group semiconductor substrate, for example, a compound semiconductor substrate, such as gallium arsenide (GaAs). The substrate LS may include a Silicon-On-Insulator (SOI) substrate.

The substrate LS may include a peripheral circuit (not shown). The peripheral circuit may include a plurality of control circuits for controlling the memory cell stacks MCS1 and MCS2. At least one control circuit of the peripheral circuit may include an N-channel transistor, a P-channel transistor, a CMOS circuit, or a combination thereof. At least one control circuit of the peripheral circuit may include an address decoder circuit, a read circuit, and a write circuit. At least one control circuit of the peripheral circuit may include a planar channel transistor, a recess channel transistor, a buried gate transistor, a fin channel transistor (FinFET), etc.

For example, at least one control circuit of the peripheral circuit may be electrically connected to a bit line BL. The peripheral circuit may include a sense amplifier SA, and the sense amplifier SA may be electrically connected to a bit line. Although not illustrated, a multi-level metal wire MLM may be positioned between the memory cell stacks MCS1 and MCS2 and the substrate LS. The peripheral circuit and the bit line BL may be coupled to each other through the multi-level metal wire MLM.

The bit line BL may extend in the third direction D3 which is parallel to the upper surface of the substrate LS. The bit line BL may be spaced apart from the substrate LS to be laterally oriented. The bit line BL may be referred to as a laterally oriented bit line. The bit line BL may include a conductive material. The bit line BL may include a silicon-based material, a metal-based material, or a combination thereof. The bit line BL may include polysilicon, a metal, a metal nitride, a metal silicide, or a combination thereof. The memory cells MC arranged laterally in a same row in the third direction D3 may share one bit line BL. The bit line BL may include polysilicon, titanium nitride, tungsten, or a combination thereof. For example, the bit line BL may include polysilicon or titanium nitride (TiN) that is doped with an N-type impurity. The bit line BL may include a stack of titanium nitride and tungsten (TiN/W). The bit line BL may further include an ohmic contact layer, such as a metal silicide.

The transistor TR may be disposed in a lateral arrangement along the second direction D2 which is parallel to the surface of the substrate LS. The transistor TR may be laterally positioned between the bit line BL and the capacitor CAP. The transistor TR may be positioned at a higher level than the substrate LS. The transistor TR and the substrate LS may be spaced apart from each other.

The transistor TR may include an active layer ACT, a gate dielectric layer GD, and a word line WL. The word line WL may extend vertically in the first direction D1, and the active layer ACT may extend in the second direction D2. The first direction D1 may be a direction perpendicular to the second direction D2. The active layer ACT may be laterally arranged with respect to the bit line BL. The active layer ACT may be oriented parallel to the plane of the substrate LS.

The word line WL may have a pillar shape penetrating the active layer ACT. The word line WL may have a cross-sectional area in the shape of a circle as sown in FIG. 1, however, other shapes may be employed without departing from the scope of the present invention. A gate dielectric layer GD may be formed on a sidewall of the word line WL. The gate dielectric layer GD may surround the sidewall of the pillar-type word line WL.

The gate dielectric layer GD may include, for example, silicon oxide, silicon nitride, a metal oxide, a metal oxynitride, a metal silicate, a high-k material, a ferroelectric material, an anti-ferroelectric, or a combination thereof. For example, the gate dielectric layer GD may include $SiO_2$, $Si_3N_4$, $HfO_2$, $Al_2O_3$, $ZrO_2$, AlON, HfON, HfSiO, HfSiON, and the like.

The word line WL may include a metal, a metal mixture, a metal alloy, or a semiconductor material. For example, the word line WL may include titanium nitride, tungsten, polysilicon, or a combination thereof. For example, the word line WL may include a TiN/W stack in which titanium nitride and tungsten are sequentially stacked. The word line WL may include an N-type work function material or a P-type work function material. The N-type work function material may have a low work function of approximately 4.5 eV or less, and the P-type work function material may have a high work function of approximately 4.5 eV or more.

The word line WL and the bit line BL may extend in intersecting directions.

The active layer ACT may include any suitable semiconductor material, including, for example, polysilicon. The active layer ACT may include a plurality of impurity regions. The impurity regions may include first and second regions SD1 and SD2, which may be a source or a drain and are referred to hereinafter also as a first source/drain region SD1 and a second source/drain region SD2. The active layer ACT may include, for example, doped polysilicon, undoped polysilicon, amorphous silicon, or an oxide semiconductor material. The first source/drain region SD1 and the second source/drain region SD2 may be doped with an N-type impurity or a P-type impurity. The first source/drain region SD1. and the second source/drain region SD2 may be doped with an impurity of the same conductivity type. The first source/drain region SD1 and the second source/drain region SD2 may be doped with an N-type impurity. The first source/drain region SD1 and the second source/drain region SD2 may be doped with a P-type impurity. The first source/drain region SD1 and the second source/drain region SD2 may include at least one impurity selected among arsenic (As), phosphorus (P), boron (B), indium (In), and combinations thereof. The bit line BL may be electrically connected to a first edge portion of the active layer ACT, and a capacitor CAP may be electrically connected to a second edge portion of the active layer ACT. The first edge portion of the active layer ACT may be provided by the first source/drain region SD1, and the second edge portion of the active layer ACT may be provided by the second source/drain region SD2.

The active layers ACT neighboring in the third direction D3 may be isolated and supported by an isolation layer IL shown in FIG. 2. The isolation layer IL may be positioned between neighboring memory cells MC in the third direction D3. The isolation layer IL may also be positioned between neighboring memory cells MC in the second direction D2. The isolation layer IL may be positioned also between neighboring memory cells MC in the first direction D1. The isolation layer IL may include a dielectric material such as an oxide.

The capacitor CAP may be disposed laterally with respect to the transistor TR. The capacitor CAP may laterally extend from the active layer ACT in the second direction D2. The capacitor CAP may include a storage node SN, a dielectric layer DE, and a plate node PN. The storage node SN, the dielectric layer DE, and the plate node PN may be laterally arranged in the second direction D2. The storage node SN may have a laterally oriented cylinder shape, and the plate node PN may have a shape extending into the cylinder inner wall and the cylinder outer wall of the storage node SN. The dielectric layer DE may be positioned inside the storage node SN while surrounding the plate node PN. The plate node PN may be coupled to the plate line PL. The storage node SN may be electrically connected to the second source/drain region SD2.

The capacitor CAP may include a Metal-Insulator-Metal (MIM) capacitor. The storage node SN and the plate node PN may include a metal-based material. The dielectric layer DE may include, for example, silicon oxide, silicon nitride, a high-k material, or a combination thereof. The high-k material may have a higher dielectric constant than silicon oxide. Silicon oxide ($SiO_2$) may have a dielectric constant of approximately 3.9, and the dielectric layer DE may include a high dielectric constant material having a dielectric constant of approximately 4 or more. The high-k material may have a dielectric constant of approximately 20 or more. The high-k material may include hafnium oxide ($HfO_2$), zirconium oxide ($ZrO_2$), aluminum oxide ($Al_2O_3$), lanthanum oxide ($La_2O_3$), titanium oxide ($TiO_2$), tantalum oxide ($Ta_2O_5$), niobium oxide ($Nb_2O_5$), or strontium titanium oxide ($SrTiO_3$). According to another embodiment of the present invention, the dielectric layer DE may be formed of a composite layer including two or more layers of the high-k materials mentioned above.

The dielectric layer DE may be formed of zirconium-based oxide. The dielectric layer DE may have a stacked structure including zirconium oxide ($ZrO_2$). The stacked structure including zirconium oxide ($ZrO_2$) may include a ZA ($ZrO_2/Al_2O_3$) stack or a ZAZ ($ZrO_2/Al_2O_3/ZrO_2$) stack. The ZA stack may have a structure in which aluminum oxide ($Al_2O_3$) is stacked over zirconium oxide ($ZrO_2$). The ZAZ stack may have a structure in which zirconium oxide ($ZrO_2$), aluminum oxide ($Al_2O_3$), and zirconium oxide ($ZrO_2$) are sequentially stacked. The ZA stack and the ZAZ stack may be referred to as zirconium oxide-based layers. According to another embodiment of the present invention, the dielectric layer DE may be formed of hafnium-based oxide. The dielectric layer DE may have a stacked structure including hafnium oxide ($HfO_2$). The stacked structure including hafnium oxide ($HfO_2$) may include an HA ($HfO_2/Al_2O_3$) stack or an HAH ($HfO_2/Al_2O_3/HfO_2$) stack. The HA stack may have a structure in which aluminum oxide ($Al_2O_3$) is stacked over hafnium oxide ($HfO_2$). The HAH stack may have a structure in which hafnium oxide ($HfO_2$), aluminum oxide ($Al_2O_3$), and hafnium oxide ($HfO_2$) are sequentially stacked. The HA stack and the HAH stack may be referred to as a hafnium oxide-based layer ($HfO_2$-based layer). In the ZA stack, ZAZ stack, HA stack, and HAH stack, aluminum oxide ($Al_2O_3$) may have a larger band gap than zirconium oxide ($ZrO_2$) and hafnium oxide ($HfO_2$). Aluminum oxide ($Al_2O_3$) may have a lower dielectric constant than zirconium oxide ($ZrO_2$) and hafnium oxide ($HfO_2$). Accordingly, the dielectric layer DE may include a stack of a high-k material and a high band gap material having a larger band gap than that of the high-k material. The dielectric layer DE may include, for example, silicon oxide ($SiO_2$) as a high band gap material other than aluminum oxide ($Al_2O_3$). Since the dielectric layer DE contains a high band gap material, leakage current may be suppressed. The high bandgap material may be extremely thin. The high band gap material may be thinner than the high-k material. According to another embodiment of the present invention, the dielectric layer DE may include a laminated structure in which a high-k material and a high band gap material are alternately stacked. For example, the dielectric layer DE may include ZAZA ($ZrO_2/Al_2O_3/ZrO_2/Al_2O_3$), ZAZAZ ($ZrO_2/Al_2O_3/ZrO_2/Al_2O_3/ZrO_2$), HAHA ($HfO_2/Al_2O_3/HfO_2/Al_2O_3$) or HAHAH ($HfO_2/Al_2O_3/HfO_2/Al_2O_3/HfO_2$). Tn the above laminated structure, aluminum oxide ($Al_2O_3$) may be extremely thin.

According to another embodiment of the present invention, the dielectric layer DE may include a stacked structure, a laminated structure, or a mixed structure including zirconium oxide, hafnium oxide, and aluminum oxide.

According to another embodiment of the present invention, an interface control layer (not shown) for improving leakage current may be further formed between the storage node SN and the dielectric layer DE. The interface control layer may include titanium oxide ($TiO_2$). The interface control layer may also be formed between the plate node PN and the dielectric layer DE.

The storage node SN and the plate node PN may include a metal, a noble metal, a metal nitride, a conductive metal oxide, a conductive noble metal oxide, a metal carbide, a metal silicide, or a combination thereof. For example, the storage node SN and the plate node PN may include titanium (Ti), titanium nitride (TiN), tantalum (Ta), tantalum nitride (TaN), tungsten (W), tungsten nitride (WN), ruthenium (Ru), ruthenium oxide ($RuO_2$), iridium oxide ($IrO_2$), platinum (Pt), molybdenum (Mo), molybdenum oxide (MoO), a titanium nitride/tungsten (TiN/W) stack, a tungsten nitride/tungsten (WN/W) stack. The plate node PN may include a combination of a metal-based material and a silicon-based material. For example, the plate node PN may be a stack of titanium nitride/silicon germanium/tungsten nitride (TiN/SiGe/WN). In the titanium nitride/silicon germanium/tungsten nitride (TiN/SiGe/WN) stack, silicon germanium may be a gap-fill material filling the cylindrical inside of the storage node SN, and titanium nitride (TiN) may serve as a plate node of a substantial capacitor CAP, and tungsten nitride may be a low-resistance material. The neighboring plate nodes PN may be commonly coupled to the plate line PL. The bottom portion of the plate line PL may be insulated from the substrate LS.

The storage node SN may have a three-dimensional (3D) structure, and the storage node SN having a 3D structure may have a lateral 3D structure which is oriented in the second direction D2. As an example of a three-dimensional structure, the storage node SN may have a cylinder shape, a pillar shape, or a pylinder shape. The pylinder shape may refer to a structure in which a pillar shape and a cylinder shape are merged.

Referring back to FIG. 3, isolation layers IL and active layers ACT may be alternately stacked in the first direction D1, and a plurality of word lines WL vertically penetrating the active layers ACT and the isolation layers IL may be formed. A plurality of bit lines BL that are laterally oriented in the third direction D3 may be formed in a direction intersecting with the word lines WL. The active layers ACT, the bit lines BL, and the storage nodes SN may be positioned at the same level.

The semiconductor device 100 of FIGS. 1 to 3 may have a mirror structure that shares the plate line PL.

FIGS. 4A to 18B illustrate a method for fabricating a semiconductor device. Hereinafter, FIGS. 4A to 18A are cross-sectional views taken along a line A-A' of FIG. 2, and FIGS. 4B to 18B are cross-sectional views taken along a line B-B' of FIG. 2.

Figure 4A:
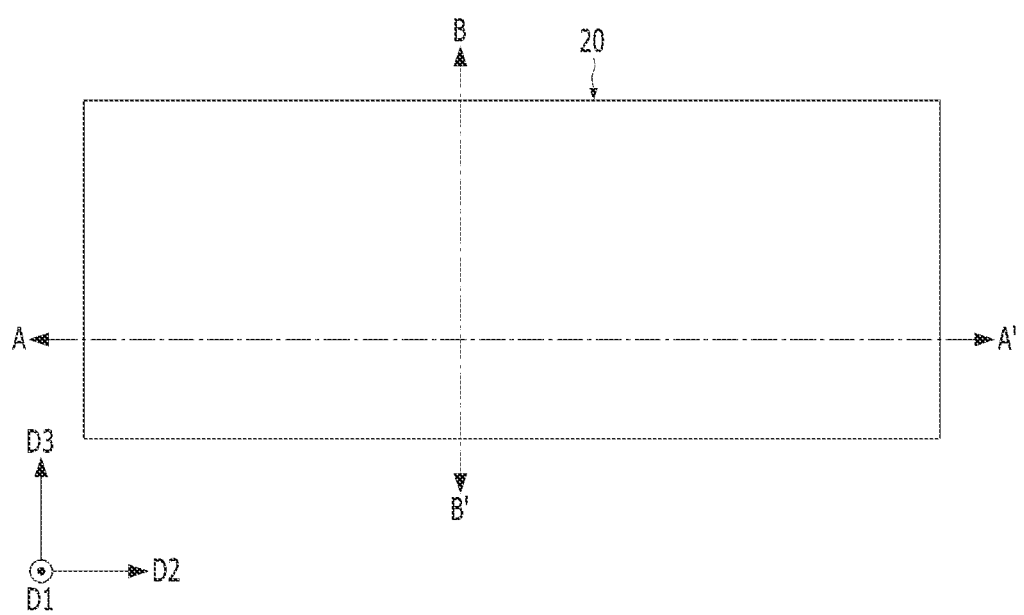
FIGS. 4A to 18B illustrate an example of a method for fabricating the semiconductor device according to an embodiment of the present invention.
Figure 4B:
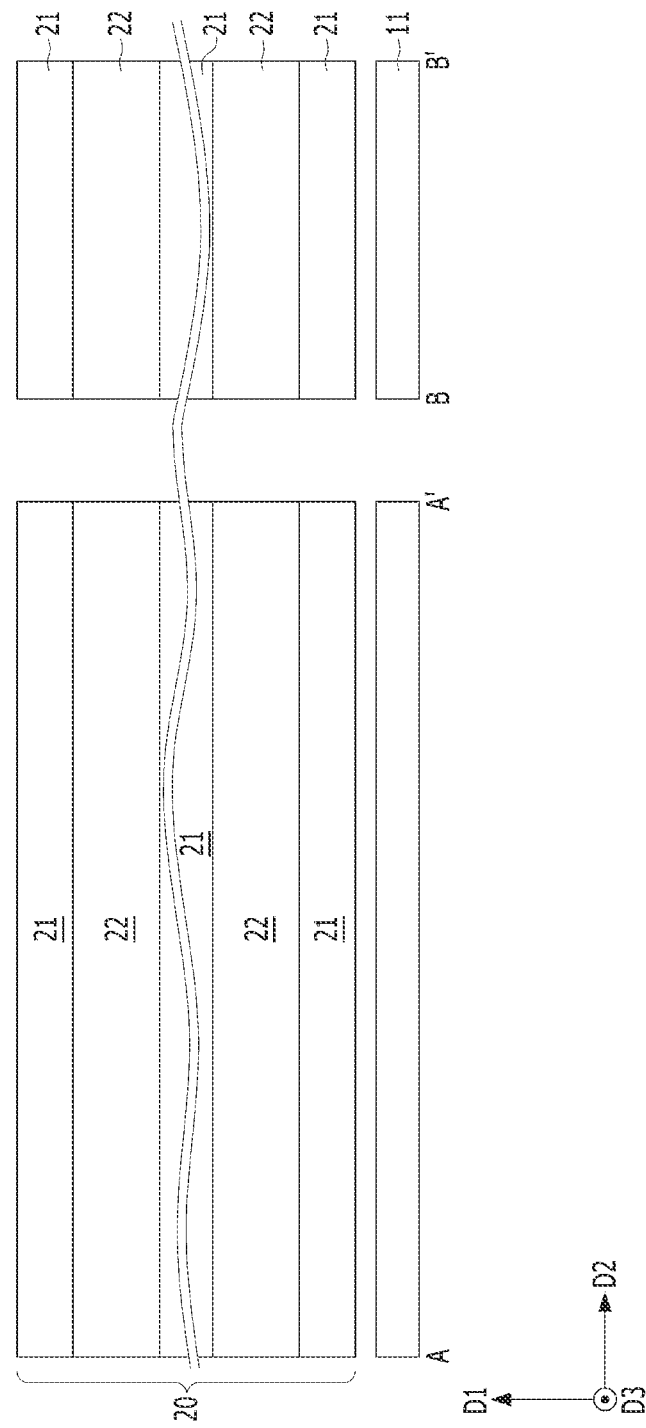

Referring to FIGS. 4A and 4B, a mold stack 20 may be formed over the substrate 11. The mold stack 20 may include a dielectric layer 21 and a semiconductor layer 22. For example, the mold stack 20 may include a plurality of dielectric layers 21 and a plurality of semiconductor layers 22 alternately stacked. The dielectric layers 21 and the semiconductor layers 22 may be vertically stacked in the first direction D1 which is perpendicular to the surface of the substrate 11. The dielectric layers 21 may, for example, include silicon oxide, and the semiconductor layers 22 may include, for example, a polysilicon layer. The lowermost layer and the uppermost layer of the mold stack 20 may be dielectric layers 21. The lowermost dielectric layer 21 may serve as an etch stop layer EST.

Figure 5A:
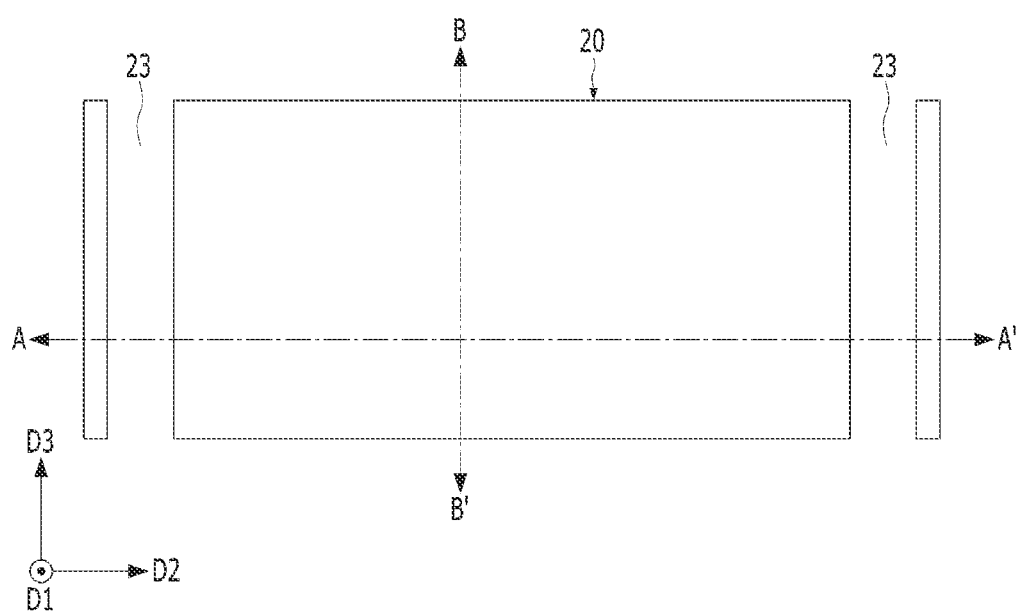

Referring to FIGS. 5A and 5B, a first trench 23 may be formed in the mold stack 20. In order to form the first trench 23, a portion of the mold stack 20 may be etched. The first trench 23 may extend vertically in the first direction D1, and may extend laterally in the third direction D3. The bottom surface of the first trench 23 may be provided by the lowermost dielectric layer 21. For example, the first trench 23 may not expose the substrate 11, and the lowermost dielectric layer 21 may be positioned between the lowermost semiconductor layer 22 and the substrate 11. The dielectric layers 21 and the semiconductor layers 22 may extend laterally in the second direction D2 which is parallel to the surface of the substrate 11.

Figure 6A:
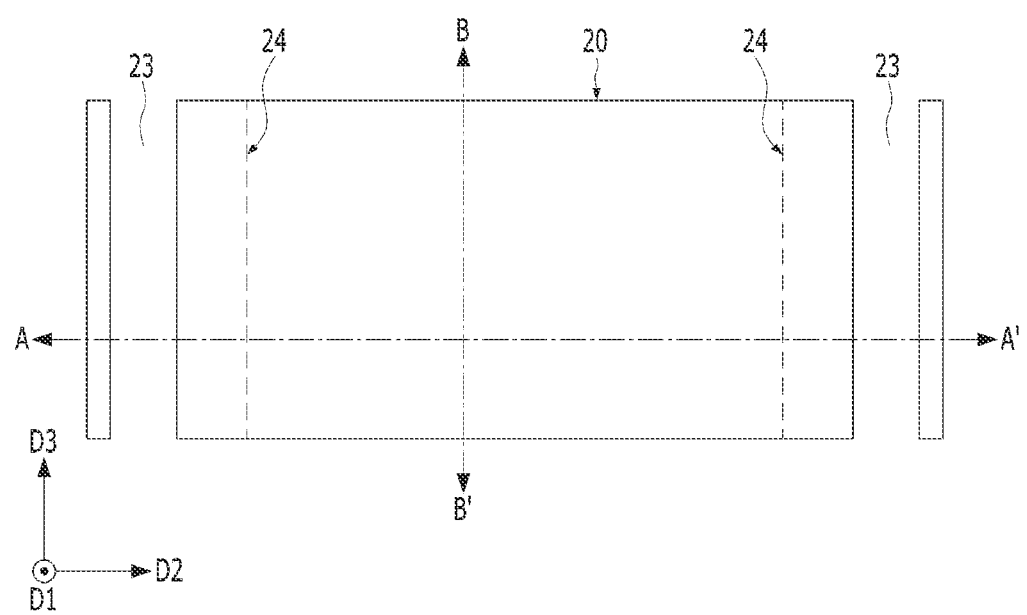
Figure 6B:
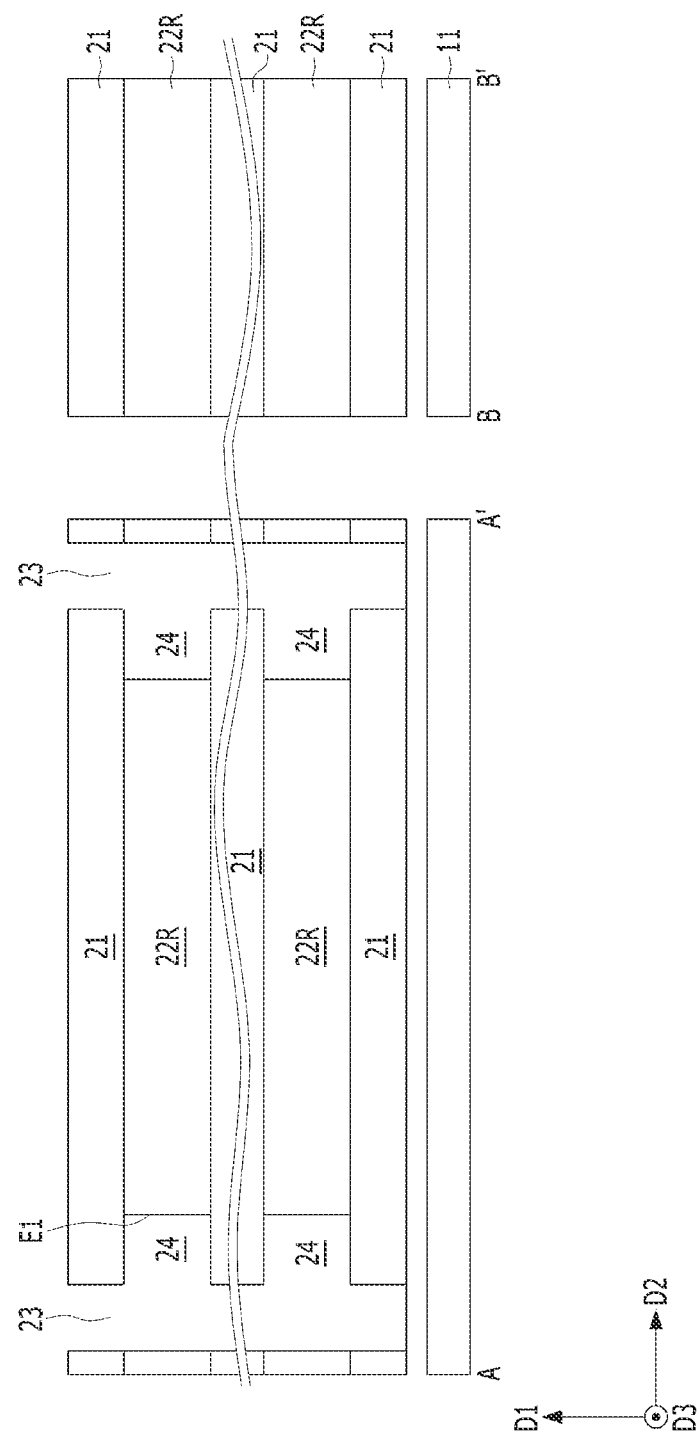

Referring to FIGS. 6A and 6B, the semiconductor layers 22 may be laterally recessed near their ends through the first trench 23 to form first recessed portions 24. Accordingly, the first recess portions 24 and the recessed semiconductor layers 22R may be positioned between the dielectric layers 21 that are vertically arranged in the first direction D1. The first recessed portions 24 may also be referred to as air gaps. The first recess portions 24 may expose the first edges E1 of the recessed semiconductor layers 22R, respectively.

Figure 7A:
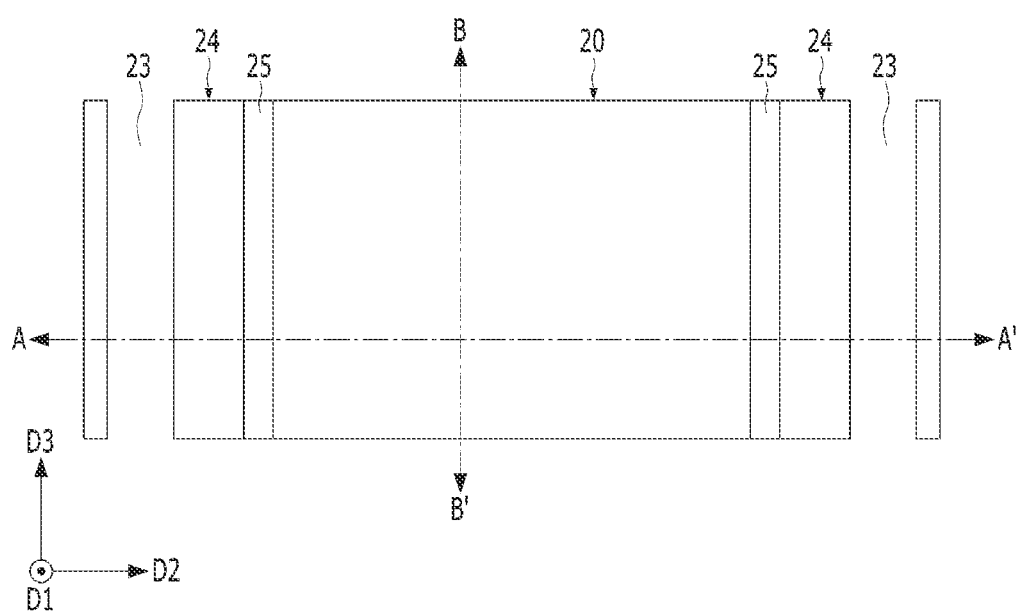
Figure 7B:
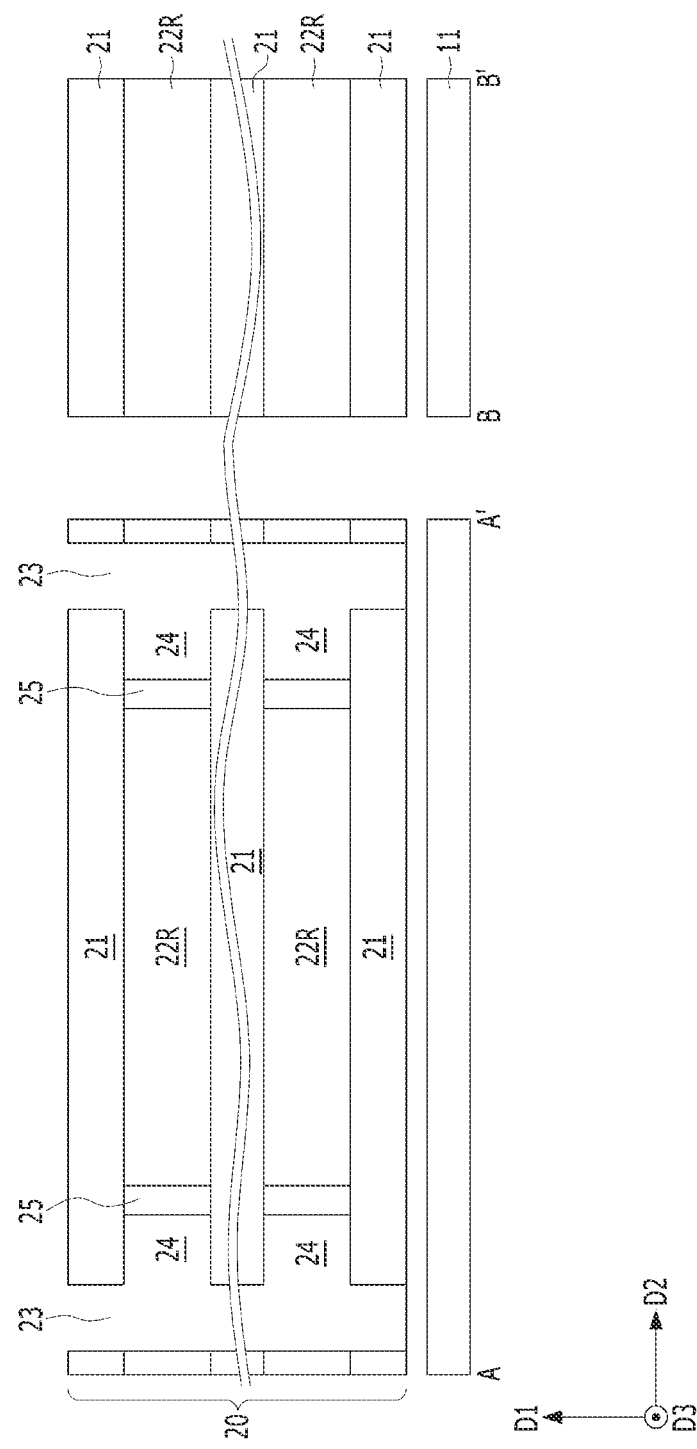

Referring to FIGS. 7A and 7B, first impurity regions 25 may be formed on the first edges E1 of the recessed semiconductor layers 22R, respectively. The first impurity regions 25 may be formed by ion implantation of an impurity through the trenches 23. For example, the first impurity regions 25 may be formed by plasma doping. The first impurity regions 25 may include an N-type impurity or a P-type impurity. The first impurity regions 25 may include for example, phosphorus, arsenic, antimony, boron, or indium. The first impurity regions 25 may be referred to as source/drain regions.

Figure 8A:
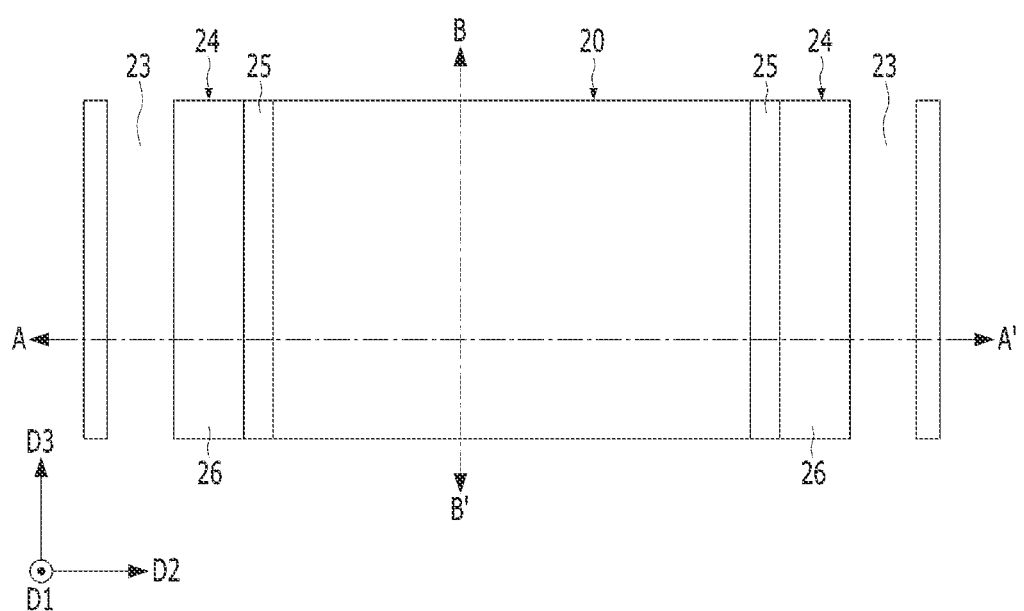

Referring to FIGS. 8A and 8B, bit lines 26 respectively coupled to the first impurity regions 25 may be formed. The bit lines 26 may be formed of a metal-based material, including, for example, titanium nitride, tungsten, titanium silicide, or a combination thereof. The bit lines 25 may fill each of the first recess portions 24. The bit lines 26 may be vertically arranged in the first direction D1. Also, each of the bit lines 26 may laterally extend in the third direction D3. The bit lines 26 may be electrically connected to the recessed semiconductor layer 22R through the first impurity regions 25, respectively.

Figure 9A:
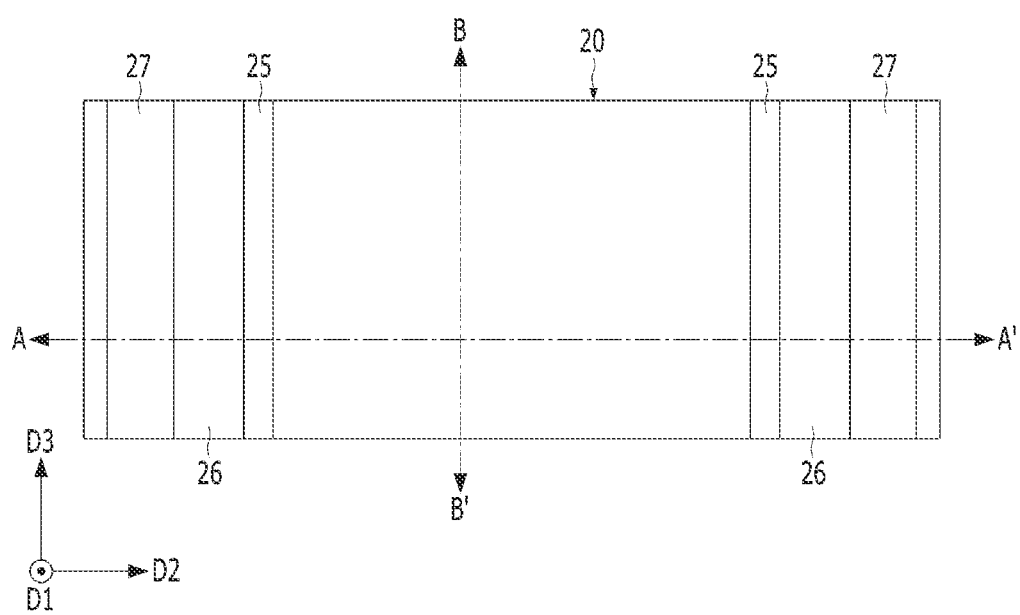
Figure 9B:
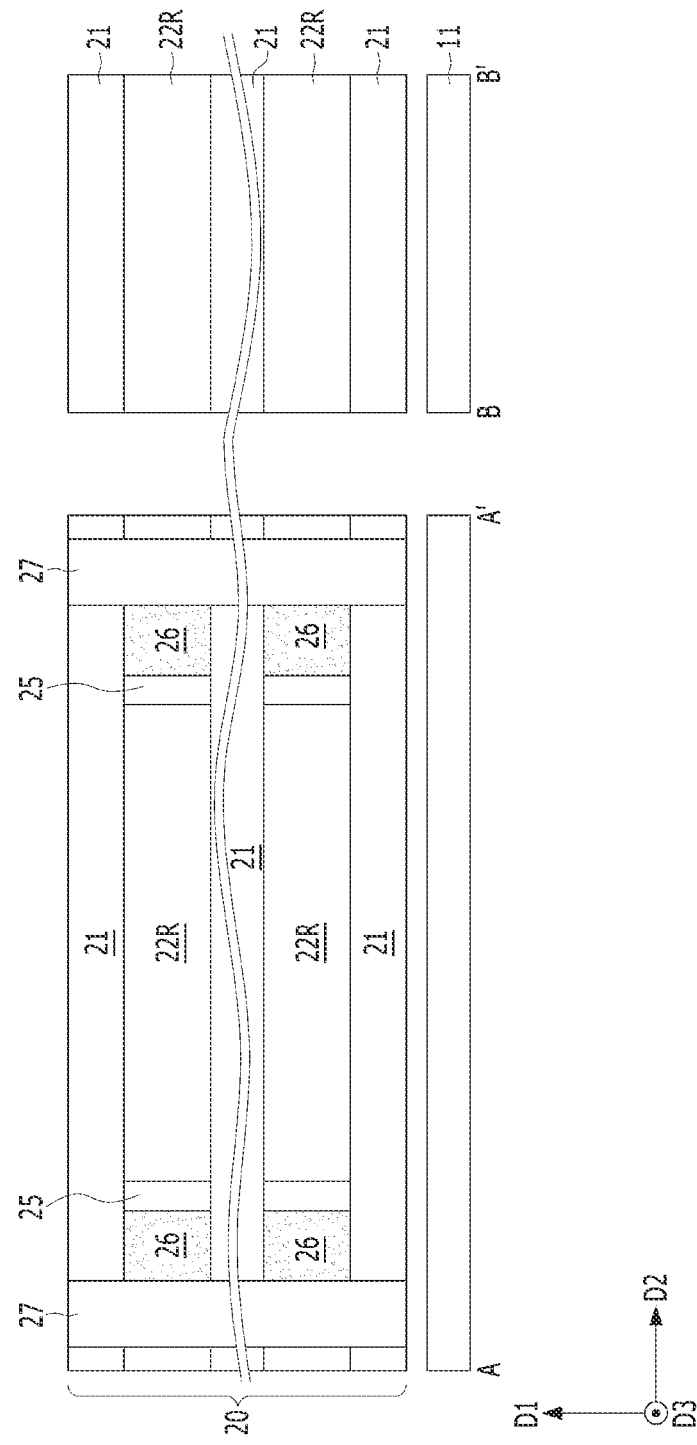

Referring to FIGS. 9A and 9B, a first isolation layer 27 may be formed in the first trench 23. The first isolation layer 27 may completely fill the first trench 23. The first isolation layer 27 may include a dielectric material. The first isolation layer 27 may include, for example, silicon oxide. For example, the first isolation layer 27 may be formed by forming silicon oxide to fill the first trench 23 and planarizing the silicon oxide.

Figure 10A:
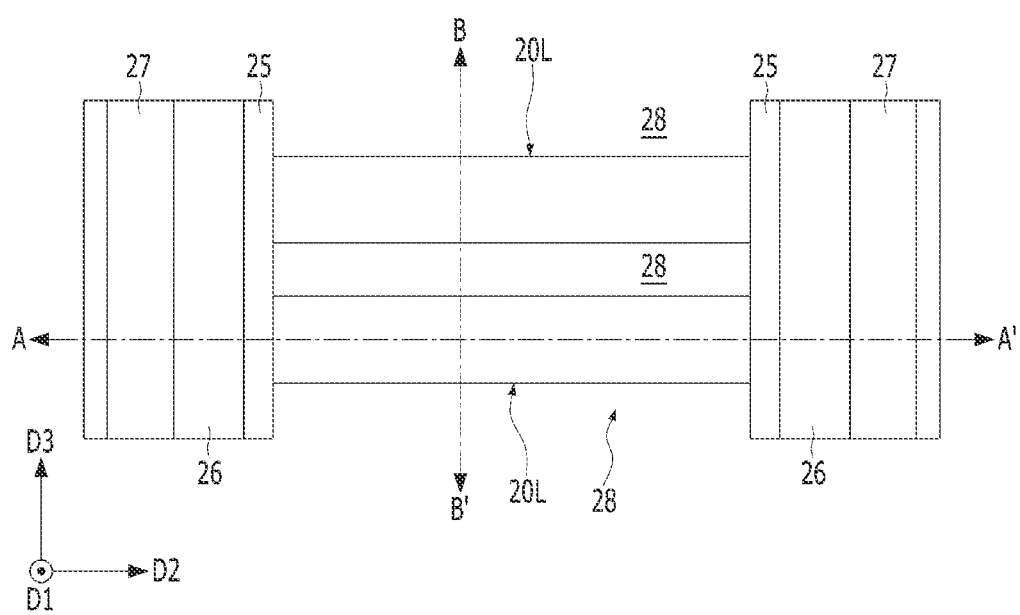
Figure 10B:
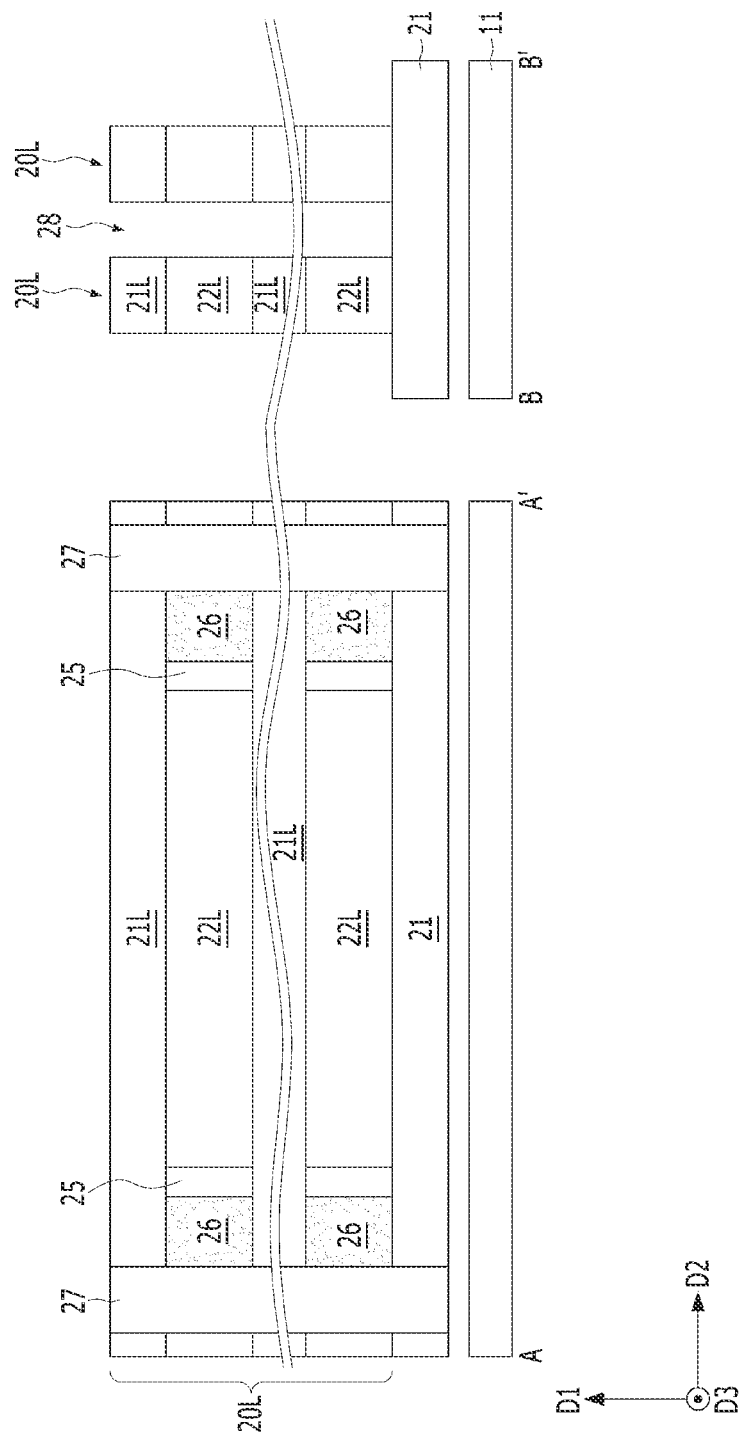

Referring to FIGS. 10A and 10B, a plurality of second trenches 28 may be formed by etching a portion of the mold stack 20. From the perspective of a top view, the second trenches 28 may extent long in the second direction D2, and may divide the mold stack 20 into a plurality of line-type stacks 20L. The second trenches 28 may be formed between the line-type stacks 20L. Both ends of the second trenches 28 may contact the first impurity regions 25. The line-type stacks 20L may be formed by alternately stacking a plurality of dielectric layer lines 21L and a plurality of semiconductor layer lines 22L. The dielectric layer lines 21L may be formed by etching the dielectric layers 21, and the semiconductor layer line 22L may be formed by etching the recessed semiconductor layers 22R. The lowermost dielectric layer 21 may remain without being etched.

Figure 11A:
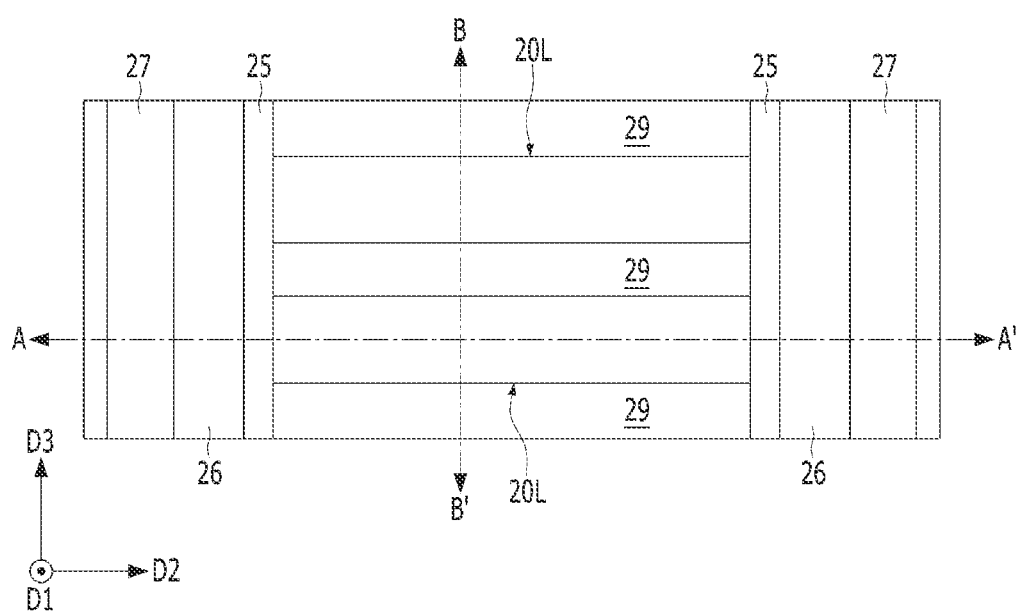
Figure 11B:
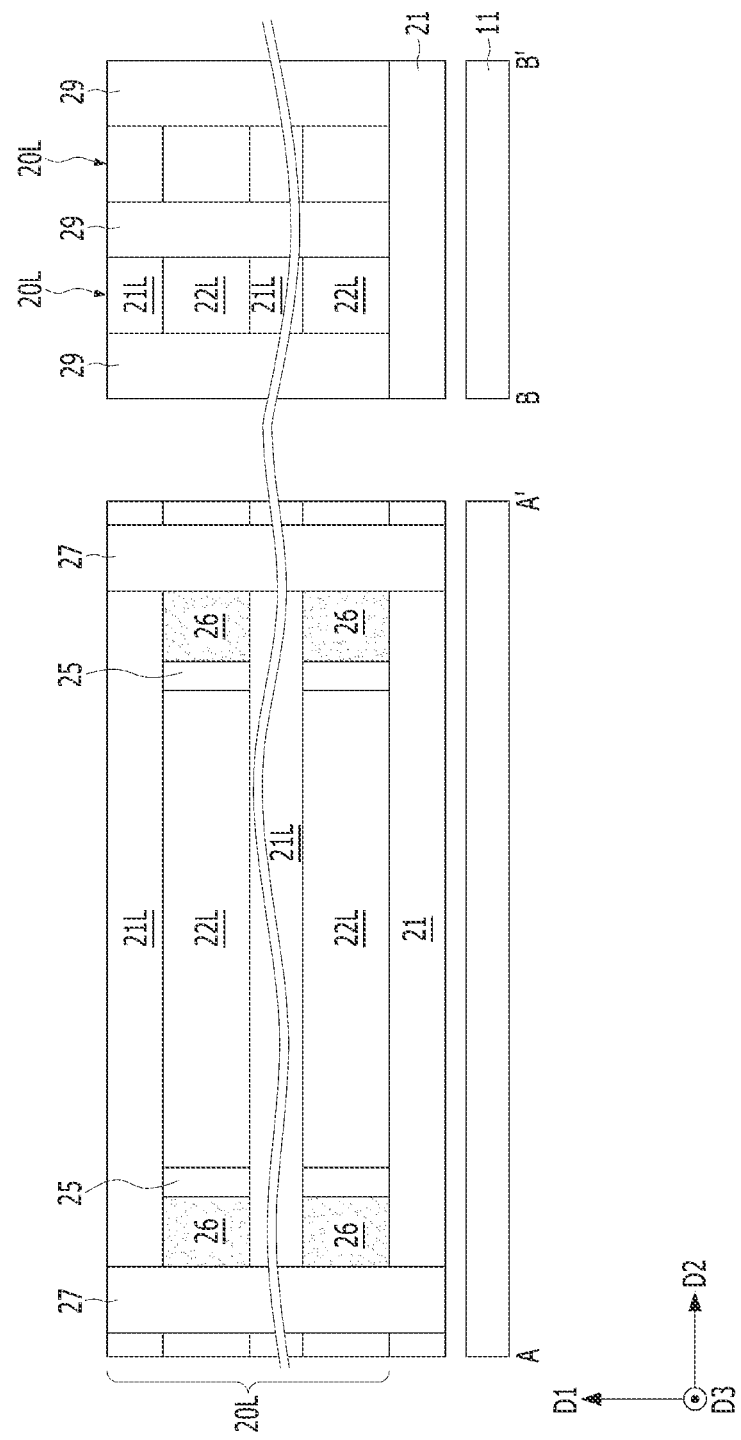

Referring to FIGS. 11A and 11B, a second isolation layer 29 may be formed in the second trenches 28. The second isolation layer 29 may completely fill the second trenches 28. The second isolation layer 29 may include a dielectric material. The second isolation layer 29 may include, for example, silicon oxide. For example, the second isolation layer 29 may be formed by forming silicon oxide to fill the second trenches 28 and then planarizing the silicon oxide.

The line-type stacks 20L may be separated from each other not only by the second isolation layer 29 but also by the neighboring first isolation layer 27. Each of the line-type stacks 20L may be formed by alternately stacking a plurality of dielectric layer lines 21L and a plurality of semiconductor layer lines 22L.

Figure 12A:
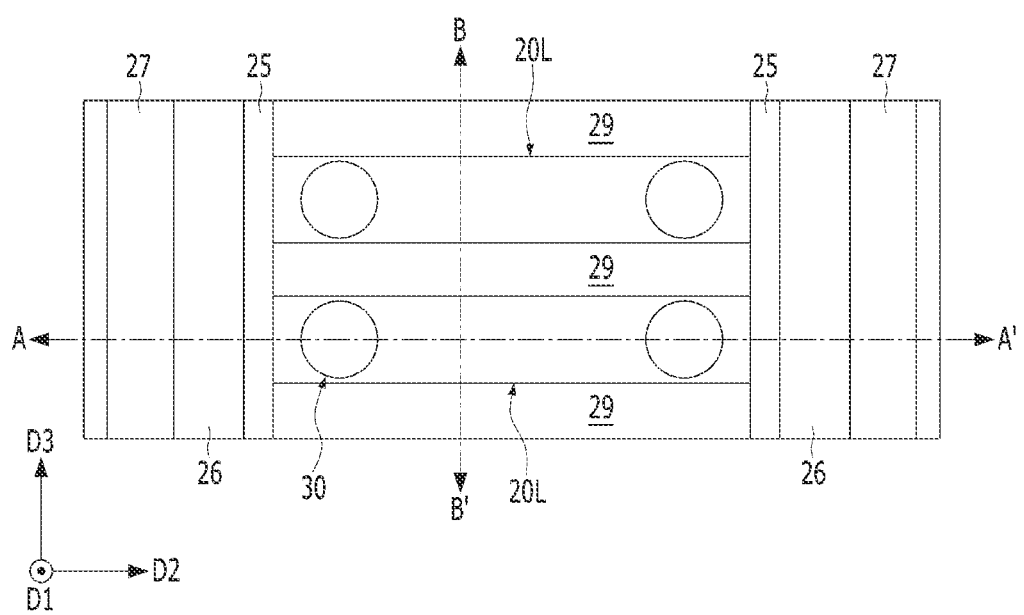
Figure 12B:
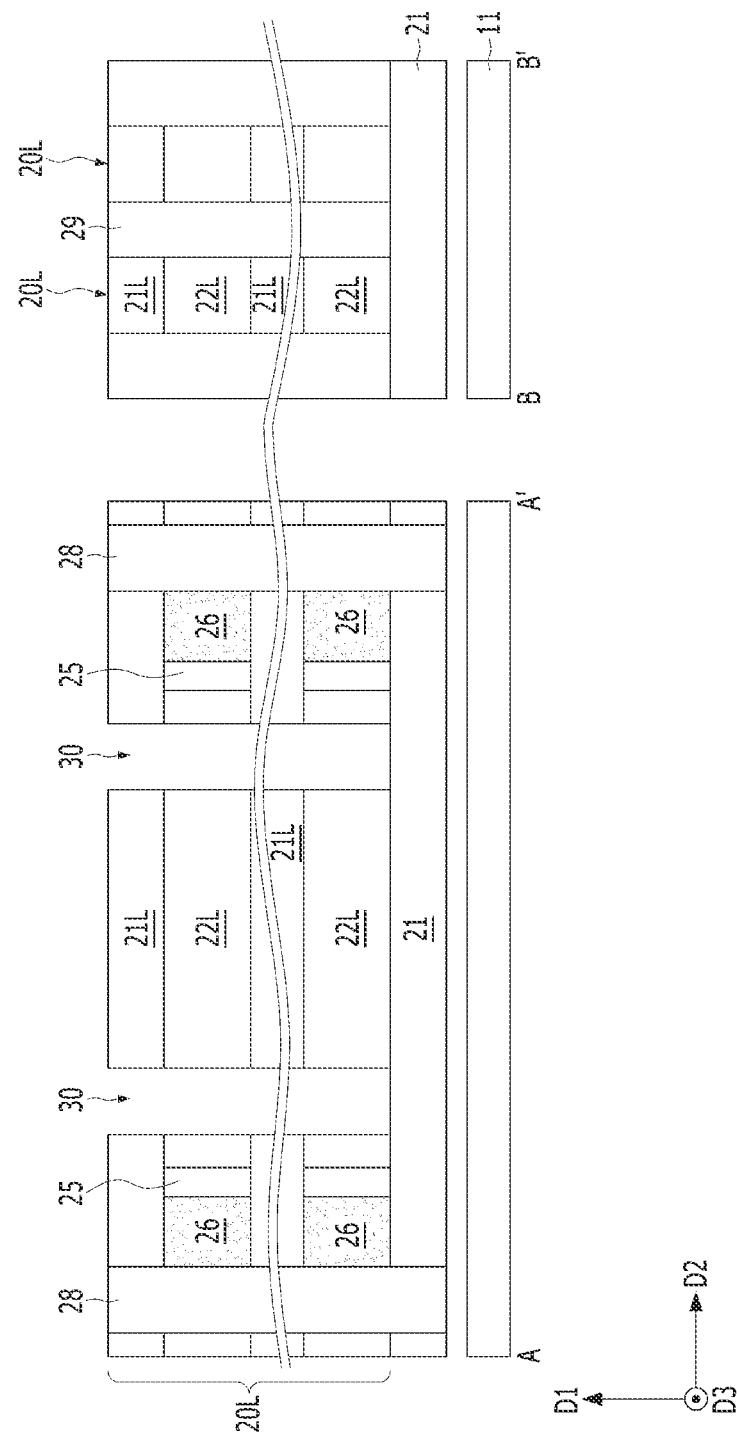

Referring to FIGS. 12A and 12B, a through hole 30 penetrating the line-type stacks 20L may be formed. The through hole 30 may extend vertically in the first direction D1. At least two through holes 30 may penetrate one individual line-type stack 20L. The through holes 30 may penetrate the (dielectric layer lines 21L and the semiconductor layer lines 22L. The through holes 30 may not penetrate the lowermost dielectric layer 21. The through holes 30 may be positioned closer to the ends of the line-type stacks 20L but may not touch the impurity regions 25.

Figure 13A:
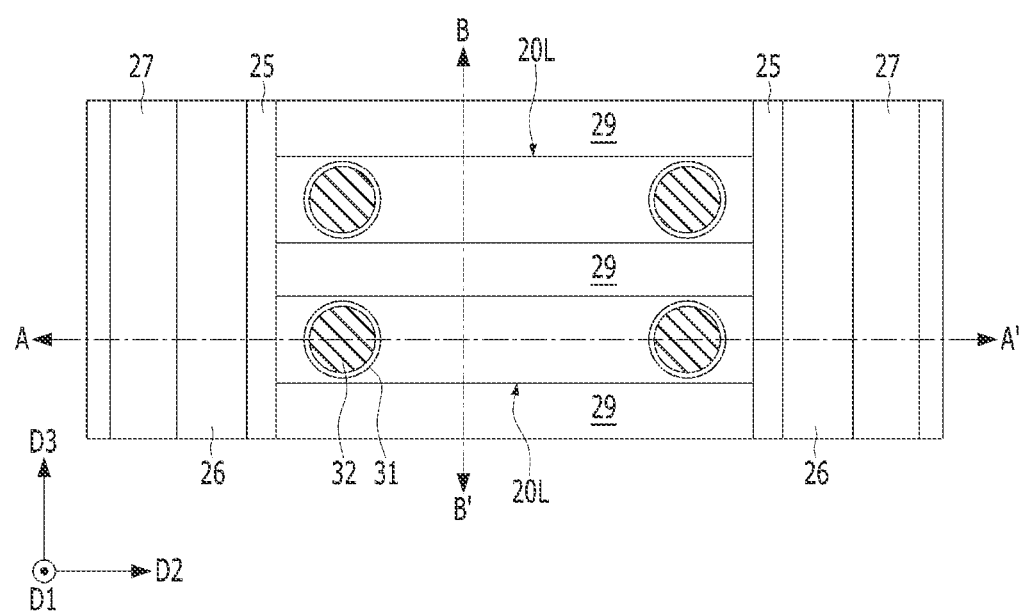
Figure 13B:
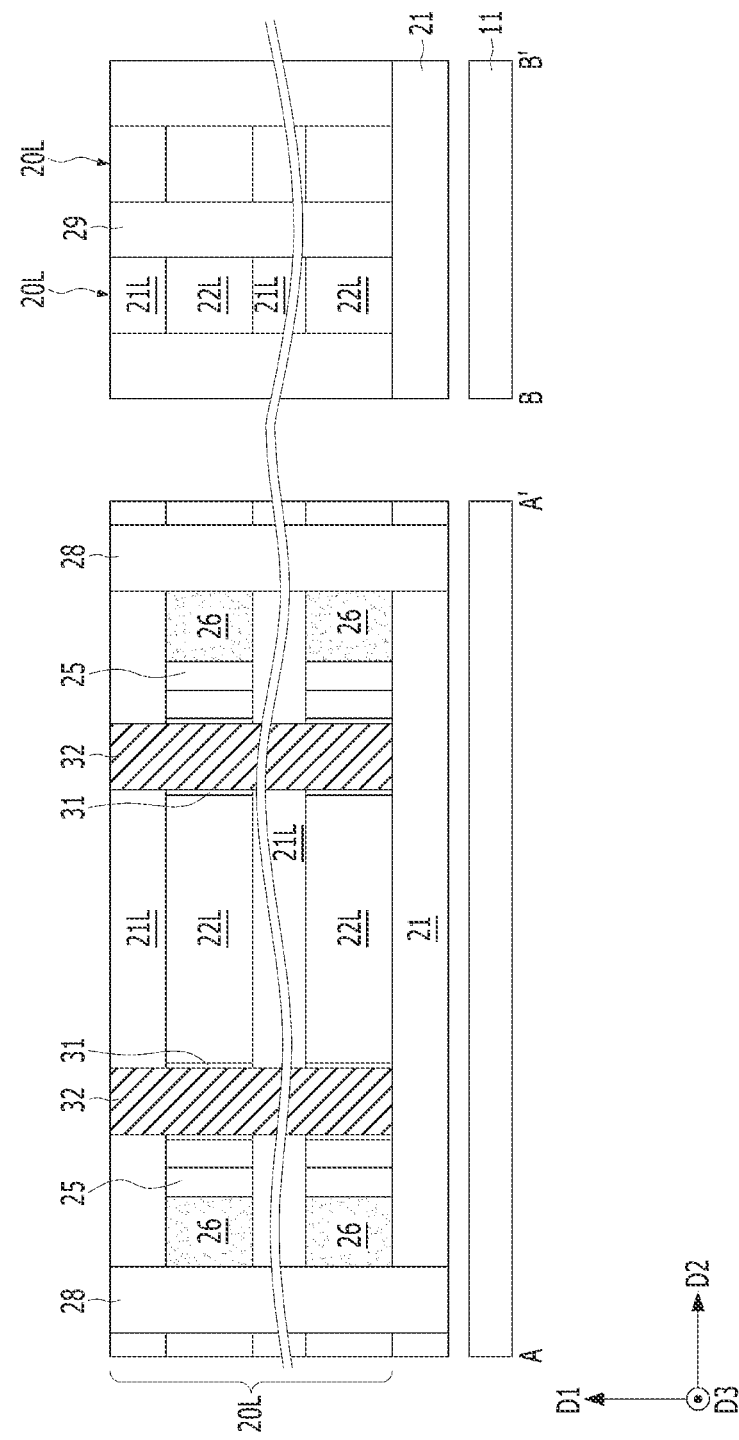

Referring to FIGS. 13A and 13B, gate dielectric layers 31 may be formed. The gate dielectric layers 31 may be formed on the sidewalls of the semiconductor layer lines 22L exposed by the through holes 30. For example, in order to form the gate dielectric layers 31, the sidewalls of the semiconductor layer lines 22L exposed by the through holes 30 may be selectively oxidized. The gate dielectric layers 31 and the semiconductor layer lines 22L may be positioned at the same level. The gate dielectric layer 31 may not be formed on the sidewalls of the dielectric layer lines 21L.

Subsequently, a word line 32 filling the through holes 30 may be formed over the gate dielectric layers 31. The word line 32 may be formed by depositing a conductive material to fill the through holes 30 and performing a planarization process, such as Chemical Mechanical Polishing (CMP). The word lines 31 may extend vertically in the first direction D1. At least two word lines 32 may penetrate one individual line-type stack 20L. The word lines 32 may penetrate the dielectric layer lines 21L and the semiconductor layer lines 22L.

Figure 14A:
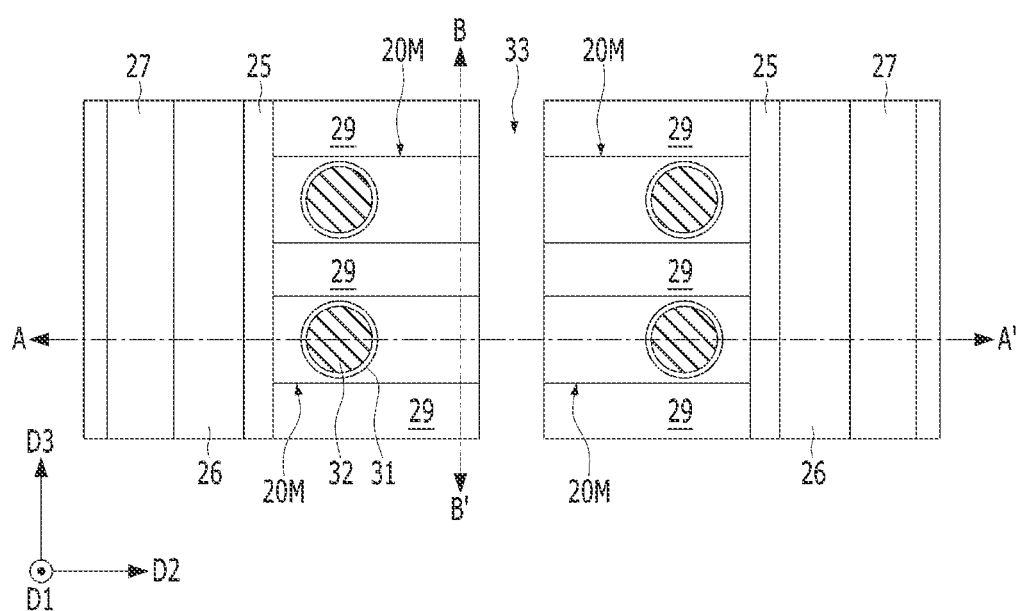
Figure 14B:
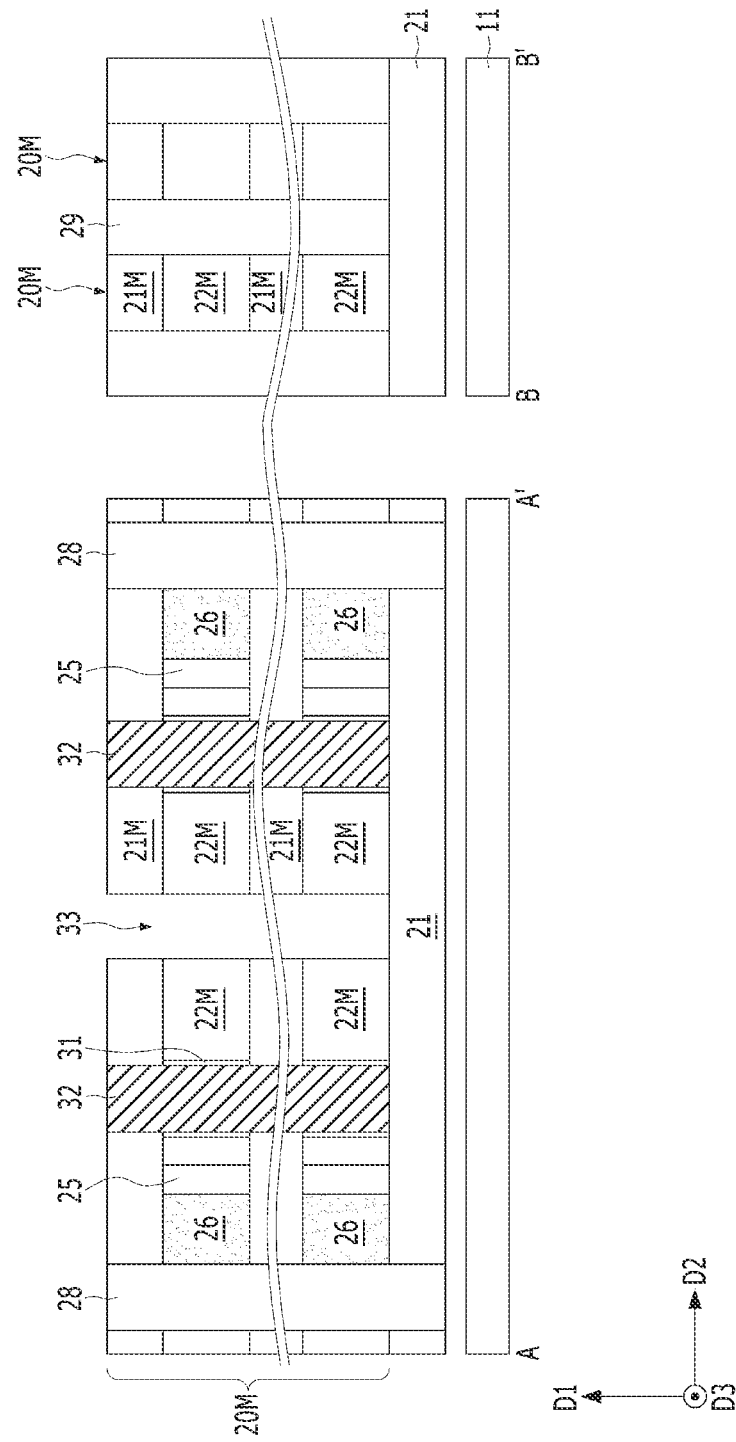

Referring to FIGS. 14A and 14B, the line-type stacks 20L may be divided into a plurality of cell stacks 20M separated by a third trench 33. For example, the third trench 33 may have a shape that traverses the center of the line-type stacks 20L in the third direction D3. The third trench 33 may also divide the dielectric layer lines 21L. The third trench 33 may cut the dielectric layer lines 21L, and the semiconductor layer lines 22L.

As the third trench 33 is formed, a plurality of cell stacks 20M may be formed over the substrate 11. Each of the cell stacks 20M may include a plurality of isolation layers 21M and a plurality of active layers 22M. Each of the cell stacks 20M may be formed by alternately stacking the isolation layers 21M and the active layers 22M. The isolation layers 21M may be formed by cutting the dielectric layer lines 21L. The active layers 22M may be formed by cutting the semiconductor layer lines 22L.

Figure 15A:
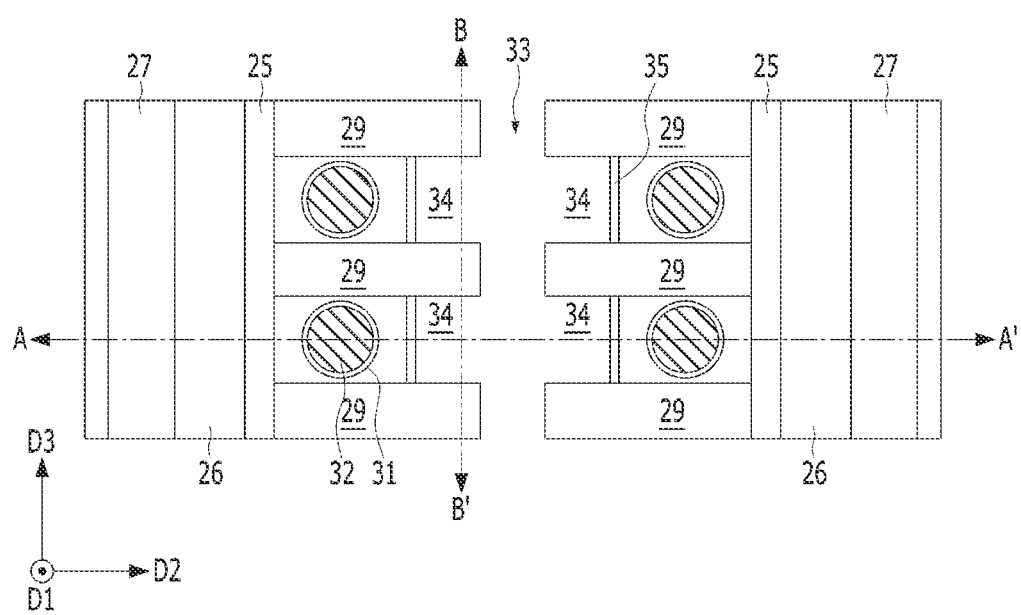
Figure 15B:
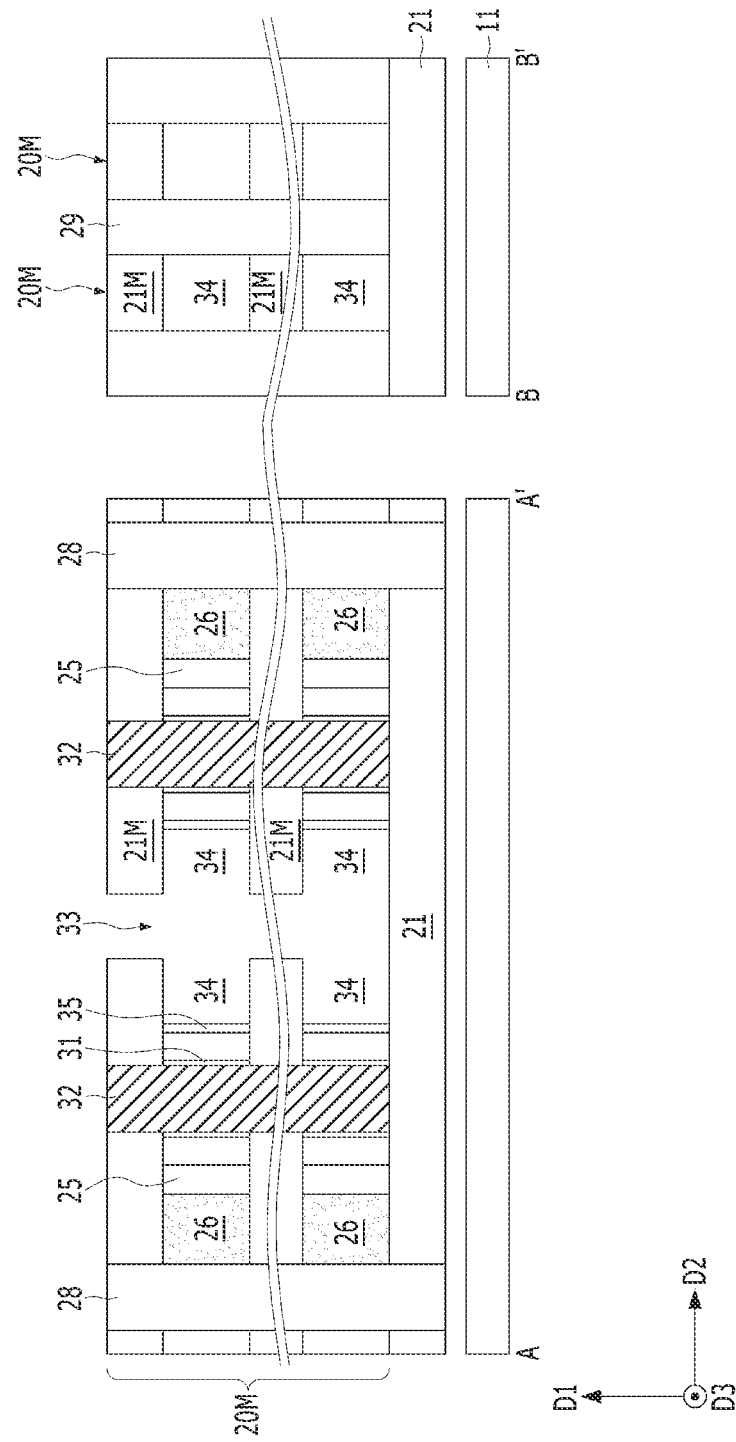

Referring to FIGS. 15A and 15B, the side of each of the active layers 22M adjacent to the third trench 33 may be selectively recessed through the third trench 33. As a result, a second recess portion 34 for forming the capacitor may be formed.

Subsequently, second impurity regions 35 may be formed in the second edges E2 of the active layers 22M exposed by the second recess portions 34, respectively. The second impurity regions 35 may be formed by ion implantation of an impurity introduced via the third trench 33. The second impurity regions 35 may be formed by a plasma doping process. The second impurity regions 35 may include an N-type impurity or a P-type impurity. The second impurity regions 35 may include phosphorus, arsenic, antimony, boron, or indium. The second impurity regions 35 may be referred to as source/drain regions. The word lines 32 may penetrate the active layers 22M, and a first impurity region 25 and a second impurity region 35 may be formed on both sides of the word lines 32.

Figure 16A:
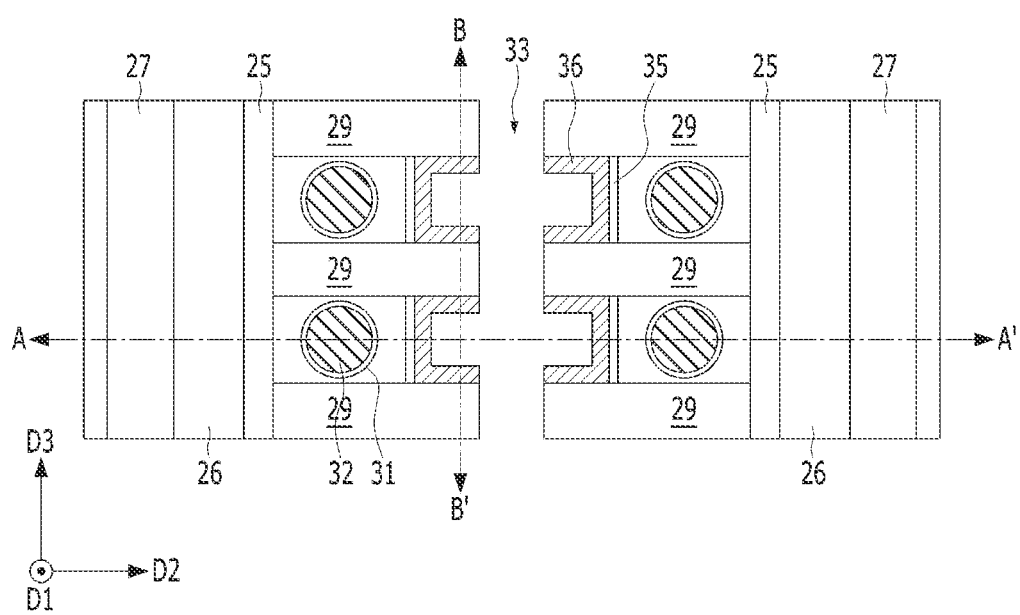
Figure 16B:
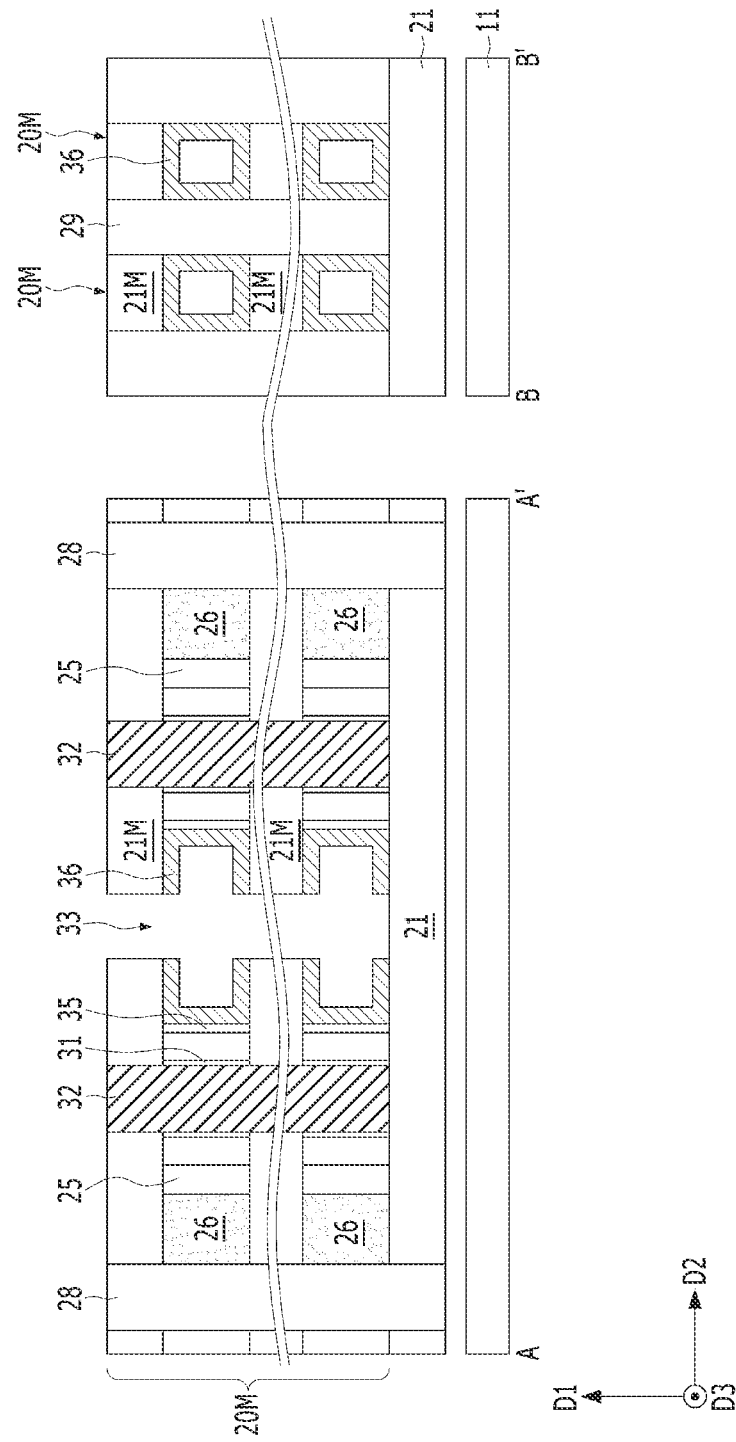

Referring to FIGS. 16A and 16B, storage nodes 36 directly coupled to the second impurity regions 35 may be formed. The storage nodes 36 may be formed of a metal-based material including, for example, titanium nitride, tungsten, titanium silicide, or a combination thereof. The storage nodes 36 may respectively fill the second recess portions 34. The storage nodes 36 may have a cylindrical shape extending laterally in the second direction D2. The storage nodes 36 neighboring in the second direction D2 may face each other with the third trench 33 therebetween. The storage nodes 36 and the isolation layers 21M may be stacked in the first direction D1.

Figure 17A:
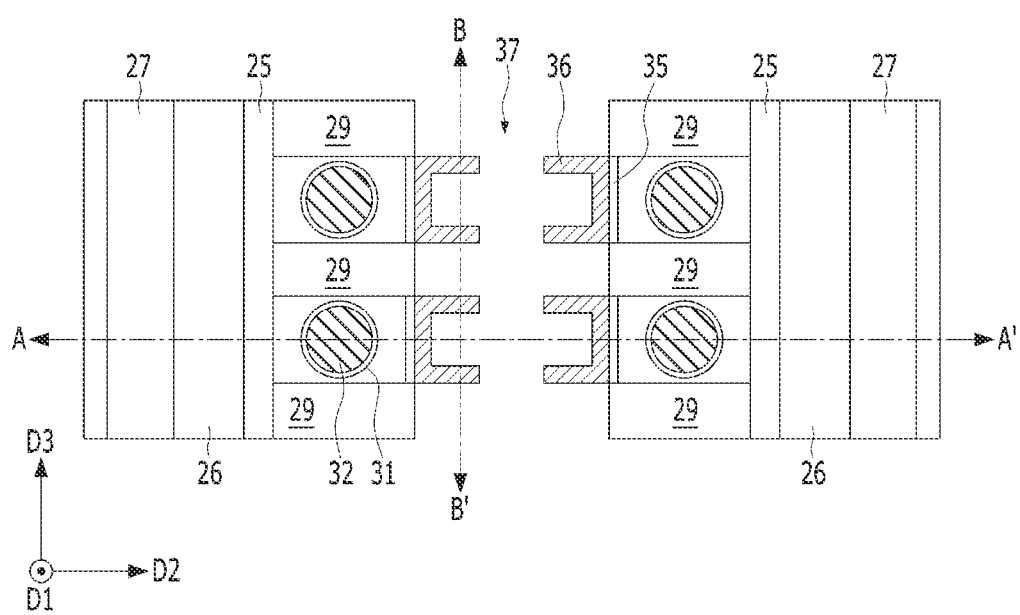

Referring to FIGS. 17A and 17B, one side of each of the isolation layers 21M may be recessed by an etching process indicated by reference numeral 37. The second isolation layer 29 may be recessed together with the isolation layers 21M. Accordingly, both inner walls and outer walls of the storage nodes 36 may be exposed.

Figure 18A:
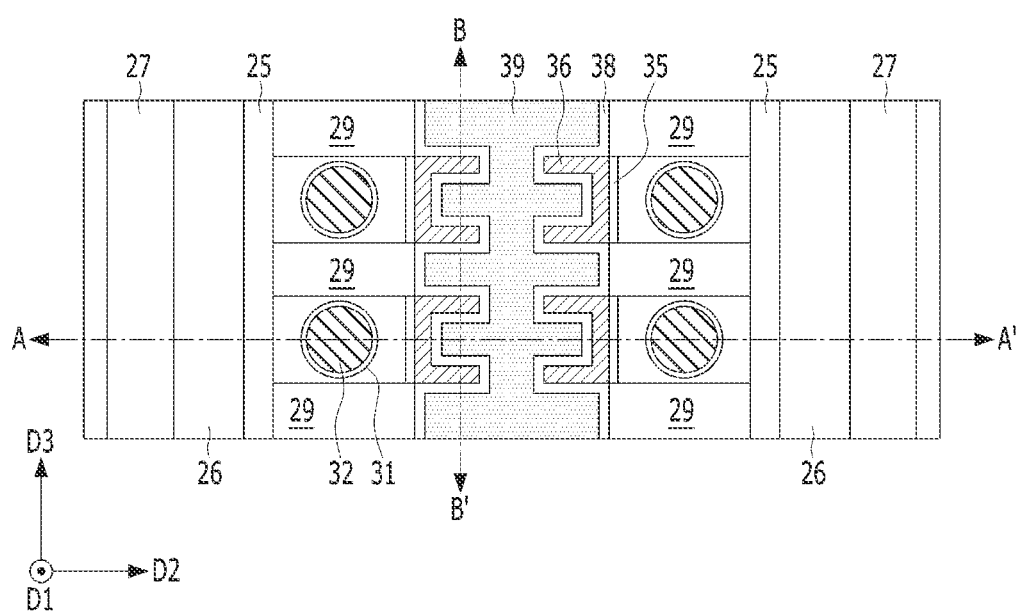
Figure 18B:
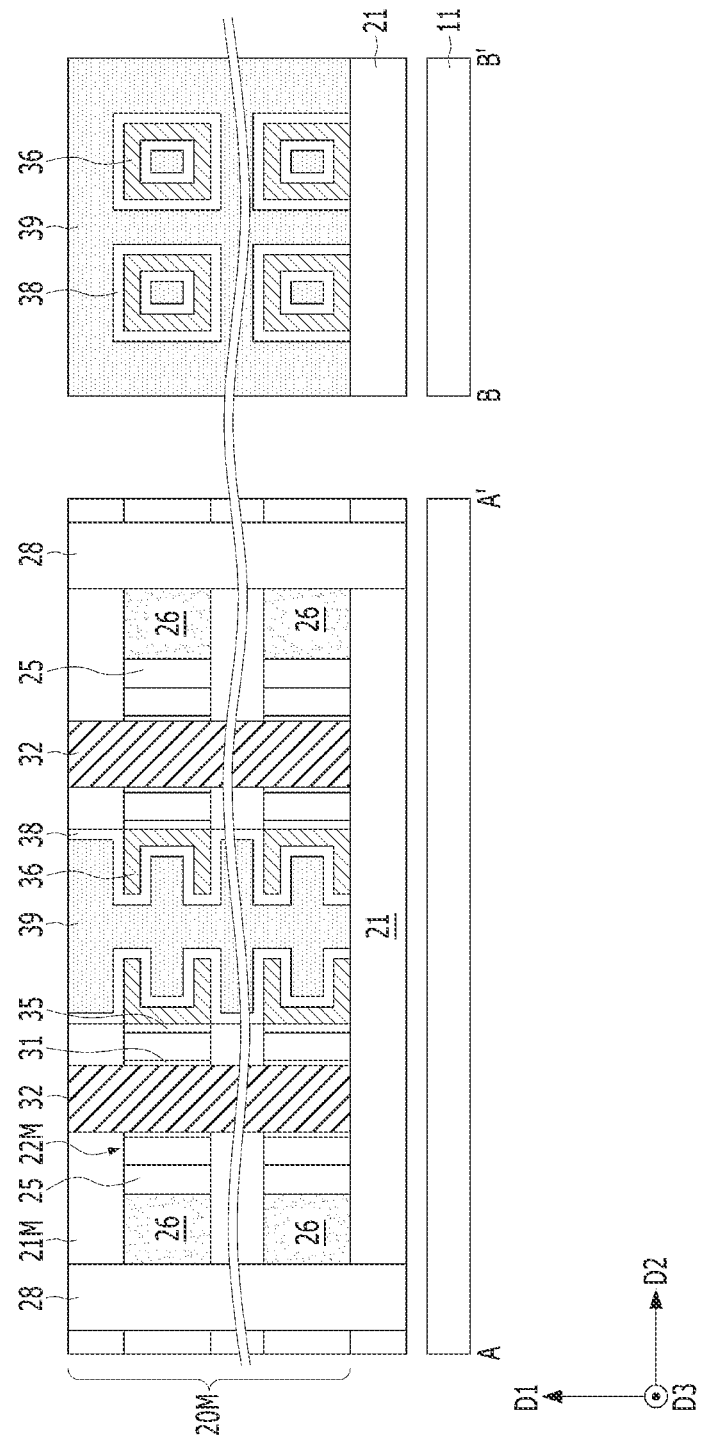

Referring to FIGS. 18A and 18B, a dielectric layer 38 may be formed over the storage nodes 36. A plate node 39 may be formed over the dielectric layer 38 to fill the trench 33.

Figure 19:
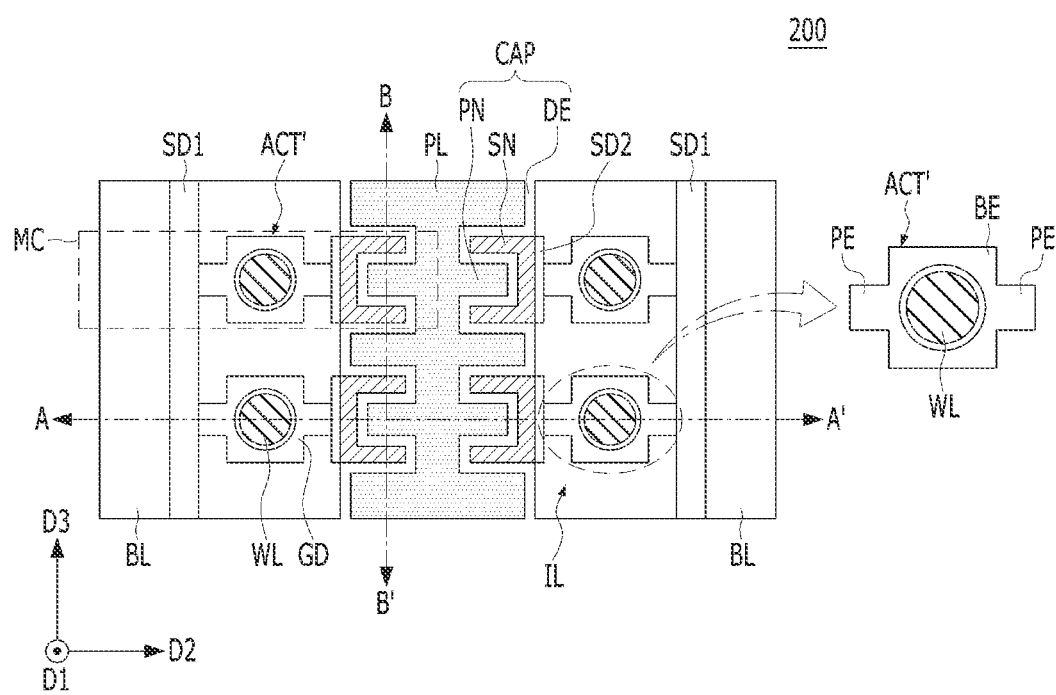
FIG. 19 is a layout of a semiconductor device in accordance with another embodiment of the present invention.

FIG. 19 is a layout of a semiconductor device 200 in accordance with another embodiment of the present invention.

Referring to FIG. 19, the same reference numerals as those in FIGS. 1 to 3 may denote the same components. The semiconductor device 200 may be similar to the semiconductor device 100 shown in FIGS. 1 to 3. Hereinafter, detailed descriptions on the constituent elements of FIG. 19 also appearing in FIGS. 1 to 3 may be omitted.

Referring to FIG. 19, the semiconductor device 200 may include a plurality of memory cells MC. Each of the memory cells MC may include a transistor TR including a bit line BL, a word line WL, an active layer ACT', and a capacitor CAP. The bit line BL may be vertically oriented in the first direction D1, and the word line WL may be laterally oriented in the third direction D3. The transistor TR may include an active layer ACT' laterally oriented in the second direction D2.

The active layer ACT' may include an active layer body BE and protrusions PE on both sides of the active layer body BE. The protrusions PE may be symmetrical to each other with respect to a center line of the active layer body BE. The active layer body BE and the protrusions PE may form a generally cross shape with the active layer body BE and the protrusions PE each having a generally rectangular shape. The protrusions PE may be substantially smaller than the active layer body BE. The protrusions PE may have a width smaller than that of the active layer body BE. For example, the width of the protrusions PE in the third direction D3 may be smaller than the active layer body BE. The word line WL may penetrate the active layer body BE.

According to embodiments of the present invention, since memory cells are vertically stacked, cell density may be improved.

While the present invention has been described with respect to the specific embodiments, it will be apparent to those skilled in the art that various changes and modifications may be made without departing from the spirit and scope of the invention as defined in the following claims.

What is claimed is:
1. A semiconductor device, comprising:
a plurality of active layers stacked in a first direction perpendicular to a substrate and laterally oriented in a second direction intersecting with the first direction, wherein each of the active layers includes a first edge portion and a second edge portion;
a plurality of bit lines each of which is coupled to the first edge portion of each of the active layers and laterally oriented in a direction intersecting with the first direction and the second direction;
a plurality of capacitors each of which is coupled to the second edge portion of each of the active layers and are arranged horizontally along the second direction;
a plate line sharing the horizontally arranged capacitors; and a word line vertically oriented penetrating the active layers in the first direction, wherein each of the capacitors comprises:

a cylindrical storage node coupled to the second edge portion of each of the active layers and have an inner wall and an outer wall;

a dielectric layer disposed over the inner wall and the outer wall of the storage node; and a plate node disposed over the dielectric layer and extending into the inner wall and the outer wall of the cylindrical storage node, wherein the plate node extends to be disposed between the storage nodes vertically stacked along the first direction.

2. The semiconductor device of claim 1, wherein the active layer includes:

an active layer body laterally oriented in the second direction; and protrusions extending in the second direction from the active layer body.

3. The semiconductor device of claim 2, wherein each of the protrusions has a smaller width than the active layer body.

4. The semiconductor device of claim 1, wherein the active layers, the bit lines, and the capacitors are positioned at the same level.

5. The semiconductor device of claim 1, wherein the cylindrical storage node is laterally oriented in the second direction.

6. The semiconductor device of claim 1, wherein the plate line commonly coupled to the plate nodes of the capacitors, wherein the plate line is vertically oriented in the first direction, and wherein the plate line divides the bit lines and the capacitors into a mirror structure.

7. The semiconductor device of claim 1, further comprising:

gate dielectric layers between the active layers and the word line.

8. The semiconductor device of claim 1, further comprising:

a plurality of first impurity regions between the first edge portion of the active layers and the bit lines; and a plurality of second impurity regions between the second edge portion of the active layers and the capacitor, wherein the first impurity regions are commonly coupled to the first edge portions of the active layers and extend parallel to the bit lines.

9. The semiconductor device of claim 1, wherein the substrate includes at least one peripheral circuit.

10. A semiconductor device, comprising:

a plurality of active layers stacked in a first direction perpendicular to a substrate and laterally oriented in a second direction intersecting with the first direction;

a plurality of bit lines each of which is coupled to a first edge portion of each of the active layers and laterally oriented in a third direction intersecting with the first direction and the second direction;

a plurality of capacitors each of which is coupled to a second edge portion of each of the active layers;

a word line vertically oriented penetrating the active layers in the first direction;

wherein each of the active layers comprise:

a common impurity region coupled to the bit lines; and a discrete impurity region coupled to each of the capacitors, wherein the common impurity region is commonly coupled to the bit lines and extend parallel to the bit lines, wherein the common impurity region is commonly coupled to the first edges of the active layers spaced horizontally along the third direction.

* * * * *